United States Patent [19]
Hosotani et al.

[11] Patent Number: 5,327,135
[45] Date of Patent: Jul. 5, 1994

[54] SERIES-PARALLEL A-D CONVERTER

[75] Inventors: Shiro Hosotani; Takahiro Miki, both of Itami, Japan

[73] Assignee: Mitsubishi Denki Kabushiki Kaisha, Tokyo, Japan

[21] Appl. No.: 12,406

[22] Filed: Feb. 2, 1993

[30] Foreign Application Priority Data

Apr. 17, 1992 [JP] Japan .................. 4-097563

[51] Int. Cl.⁵ .............................................. H03M 1/14
[52] U.S. Cl. ...................................... 341/156; 341/118
[58] Field of Search ............................. 341/118, 156

[56] References Cited

U.S. PATENT DOCUMENTS

| | | | |
|---|---|---|---|
| 4,533,903 | 8/1985 | Yamada et al. | 341/156 |
| 4,599,599 | 7/1986 | Sekino et al. | 341/133 |
| 4,635,036 | 1/1987 | Yoshizawa | 341/156 |
| 5,099,240 | 3/1992 | Nakatani et al. | 341/156 |
| 5,194,866 | 3/1993 | Imaizumi et al. | 341/156 |

*Primary Examiner*—Marc S. Hoff
*Attorney, Agent, or Firm*—Oblon, Spivak, McClelland, Maier & Neustadt

[57] ABSTRACT

Low-order reference potentials including high-order reference potentials (VRT, VRB, VC0 to VC6) generated from a ladder resistor and potentials (V(i, j) (i=0 to 7, j=0 to 6)) are applied to potential lines, respectively, to be transmitted by various switches to analog bus lines (FR0a to FR14a) or analog bus lines (FR0b FR14b). The low-order reference potentials are applied to the analog bus lines (FR0b to FR14b) when it is judged that a sample signal potential falls in voltage zones (Z0 to Z3) as a result of comparison with the high-order reference potentials and are applied to the analog bus lines (FR0a to FR14a) when it is judged that the sample signal potential falls in voltage zones (Z4 to Z7). This provides for reduction in the number of switches connected to each analog bus line and in parasitic capacitance, so that a settling time of the low-order reference potentials is shortened. High-speed operation of a series-parallel A-D converter is achieved.

27 Claims, 17 Drawing Sheets

(j=1,2,...,6)

SERIES-PARALLEL A-D CONVERTER

BACKGROUND OF THE INVENTION

1. Field of the Invention

The present invention relates to an analog-to-digital converter and more particularly to a series-parallel A-D converter.

2. Description of the Background Art

FIG. 15 is a diagram of a conventional series-parallel A-D converter disclosed by Andrew G. F. Dingwall in "An 8-MHz CMOS Subranging 8-Bit A/D Converter", IEEE Journal of Solid States Circuits, vol. SC-20, NO. 6, pp. 1138-1143, December 1985. For the purpose of simplification, high-order (coarse) resolution of the A-D converter is three bits long, low-order (fine) resolution thereof is three bits long, and redundancy for error correction is one bit long. Referring to FIG. 15, a reference potential generating circuit 1 outputs high-order reference potentials for 3-bit high-order conversion to high-order reference potential output lines CR0 to CR6 and outputs low-order reference potentials for 4-bit low-order conversion (including the error correction bit) to analog bus lines FR0 to FR14 as a function of high and low potential references VRT and VRB applied respectively to terminals 2 and 3 and a control signal 32 inputted to a signal line 4.

High-order voltage comparators CC0 to CC6 compare the potential of an analog signal to be converted (hereinafter referred to as a "sample signal") which is inputted to a terminal 5 with the high-order reference potentials to give the result to a high-order encoder 6. The high-order encoder 6 gives the control signal 32 and a 3-bit high-order A-D conversion result 33 to the signal line 4 and an error correction circuit 7, respectively.

Low-order voltage comparators FC0 to FC14 compare the sample signal potential with the low-order reference potentials to give the result to a low-order encoder 8. The low-order encoder 8 gives a 3-bit low-order A-D conversion result to a terminal 9 and gives an error detection signal 34 to the error correction circuit 7 through a signal line 10, respectively.

The error correction circuit 7 corrects errors of the high-order A-D conversion result 33 as a function of the error detection signal 34 to give a corrected 3-bit high-order A-D conversion result 35 to a terminal 11.

A structure of the reference potential generating circuit 1 to be used for the series-parallel A-D converter is shown in FIG. 16. The reference potential generating circuit 1 used for 6-bit A-D conversion includes $2^6$ resistors r connected in series between the terminals 2 and 3 and having the same resistance to form a ladder resistor. The ladder resistor is divided into $2^3$ resistor groups R0 to R7 each including $2^3$ adjacent resistors connected in series. The connecting points of the eight resistor groups R0 to R7 are connected to the high-order voltage comparators CC0 to CC6 through the high-order reference potential output lines CR0 to CR6. The high-order reference potential output lines CR0 to CR6 are connected to the connecting points CRl (l=0 to 7) of the resistor groups Rl and R(l+1). Potentials VCl at the connecting points CRl, the potentials VRT, VRB at the terminals 2, 3 and divided potentials V(l,m) (l=0 to 7, m=0 to 6) in the resistor groups R0 to R7 serve as the reference potentials and are inputted to a switch matrix 12. Fifteen potentials having adjacent levels among the reference potentials are applied to the analog bus lines FR0 to FR14 by the control to be described later to be inputted to the voltage comparators FC0 to FC14 as the low-order reference potentials.

An arrangement of the switch matrix 12 is shown in FIG. 17. The horizontal lines of FIG. 17 represent potential lines connected to the points connecting the $2^6$ resistors and to the terminals 2, 3, and potentials of 65 levels are applied to the potential lines. The higher potentials of the 65 levels are applied to the upper lines of FIG. 17. The potentials of 65 levels are classified into eight voltage zones Z0 to Z7. That is, the voltage zone Z0 includes the low-order reference potentials satisfying:

$$VRB < V(0,i) < V(0,i+1) < VC0 \ (i=0, 1, \ldots, 5) \quad (1).$$

The voltage zones Zj (j=1, 2, ..., 6) include the low-order reference potentials satisfying:

$$VC(j-1) < V(j,i) < V(j,i+1) < VCj \ (i=0, 1, \ldots, 5) \quad (2).$$

The voltage zone Z7 includes the low-order reference potentials satisfying:

$$VC6 < V(7,i) < V(7,i+1) < VRT \ (i=0, 1, \ldots, 5) \quad (3).$$

The potentials VCj thus belong to both the zones Zj and Z(j+1). Relation between the potential lines to which the potentials V(j, i) are applied and the zones Zj is shown in detail in FIG. 18 where VC(j−1) when j=1 indicates VRB and VCj when j=6 indicates VRT.

The vertical lines of FIG. 17 represent the analog bus lines FR0 to FR14 to which fifteen out of 65 levels of potentials are applied by switch groups to be classified in the manner as described below. The application is performed by eight switch groups which perform different operations depending on the result of the high-order A-D conversion provided by the control signal 32 of FIG. 15. The switch groups indicated by [0], [1], [2], [3], [4], [5], [6], [7] turn on when the potential of the sample signal falls in the voltage zones Z0, Z1, Z2, Z3, Z4, Z5, Z6, Z7 as a result of the high-order A-D conversion, respectively.

The series-parallel A-D converter operates in two stages. In the first stage, the sample signal potential is compared with the high-order reference potentials applied to the high-order reference potential output lines CR0 to CR6 in the high-order voltage comparators CC0 to CC6 (FIG. 15), respectively. The comparison result is converted to the high-order A-D conversion result 33 composed of 3-bit binary codes through the high-order encoder 6.

In the second stage, the control signal 32 outputted from the high-order encoder 6 is inputted to the reference potential generating circuit 1 through the signal line 4. If the sample signal potential falls, for example, in the voltage zone Z3 as a result of the high-order A-D conversion, only the switches indicated by [3] should be turned on. However, contradictions are sometimes caused between the high-order and low-order A-D conversion results. The low-order reference potentials are determined in the voltage zones including and wider than the voltage zone Z3 so that the error correction is enabled to be made against the contradictions in the error correction circuit 7. In this example, an allowance of ±4LSB is added to the voltage zone Z3 to determine the low-order reference potentials. Since the high-order reference potential VC3 belongs to both the voltage zones Z3 and Z4, the bus line FR11 connected through the switches disposed therein is counted twice. The LSB is a voltage corresponding to one bit of the A-D converter and is equal to a potential difference across the resistor r in this case. The switches also turn on which are indicated by [3] and disposed on the four bus lines FR11 to FR14 (corresponding to potentials higher than the maximum of the voltage zone Z3) and the four bus lines FR0 to FR3 (corresponding to potentials lower than the minimum of the voltage zone Z3).

The operating speed of the series-parallel A-D converter largely depends on a settling time of the low-order reference potentials outputted from the reference potential generating circuit 1 to the analog bus lines FR0 to FR14. Since the low-order reference potentials are applied to the low-order voltage comparators FC0 to FC14 through the analog bus lines FR0 to FR14 having a large parasitic capacitance, the settling time thereof prevents the high-speed operation of the A-D converter. In the conventional A-D converter for totaling six bits composed of three bits for high-order conversion and three bits for low-order conversion, if 1-bit high-order redundancy is provided, the number of analog bus lines is:

$$(2^3-1)+2^3=15 \qquad (4)$$

The number of switches per bus line is at least eight (respective one switch indicated by [0], [1], [2], [3], [4], [5], [6], [7]). Letting the parasitic capacitance of the switches and wires per analog bus line be 1 pF, the total capacitance of fifteen analog bus lines is 15 pF. This means that the capacitance of 15 pF is added to each section of the ladder resistor corresponding to the respective eight voltage zones in accordance with the high-order A-D conversion result. This capacitance exponentially increases as the number of switches increases with the increase in the number of bits of the A-D conversion.

This causes the level of the low-order reference potentials to vary largely transiently when the switches are opened and closed, so that it takes time to settle the level on the original level. The settling time is shortened by reducing the impedance of the ladder resistor. However, for reduction in the impedance of the resistor, it is necessary to increase the cross-sectional area thereof, resulting in a large layout area unpreferably. The analog bus lines accordingly need long wires, accompanied by large wiring capacitance. Thus such attempt is not so effective.

Another factor that prolongs the settling time of the low-order reference potentials is large variation in sample signal level. Which one of the eight resistor groups R0 to R7 outputs the low-order reference potentials depends on the sample signal level. In extreme case, the switches indicated by [7] turn on in response to a first sample signal and the switches indicated by [0] turn on in response to the next sample signal. In this case, the potentials in the voltage zone Z7 nearest to the terminal 2 which have the highest level among the eight voltage zones are applied to the analog bus lines FR0 to FR14 in response to the first sample signal. The potentials in the voltage zone Z0 nearest to the terminal 3 which have the lowest level are applied thereto in response to the next sample signal. Since the potential difference between the terminals 2 and 3 is equal to the maximum amplitude of the sample signal detected by the A-D converter, a potential variation approximate to the maximum amplitude takes place in response to the sample signals in the analog bus lines FR0 to FR14 under the foregoing conditions. This is not so significant a problem since the analog bus lines FR0 to FR14 are connected to the connecting points of the resistors adjacent the terminals 2, 3 having the low impedance in response to the two sample signals. However, the settling time of the low-order reference potentials grows long when the potential variation of the analog bus lines FR0 to FR14 is large and the second sample signal potential falls in the voltage zone having a large impedance of the ladder resistor, e.g., in such a case that the switches indicated by [7] or [0] turn on in response to the first sample signal and the switches indicated by [3] or [4] turn on in response to the second sample signal.

As above described, since the analog bus lines have the large parasitic capacitance and, in particular, the low-order reference potentials to be applied to the analog bus lines largely vary in accordance with the sample signal level, the conventional series-parallel A-D converter is disadvantageous in that the low-order reference potentials outputted from the reference potential generating circuit take a long settling time which prevents the high-speed operation thereof.

SUMMARY OF THE INVENTION

According to the present invention, a series-parallel A-D converter comprises an input terminal receiving a sample signal to be A-D converted, a high potential point, a low potential point, a plurality of resistor groups connected in series between the high potential point and the low potential point for dividing a potential difference between the high potential point and the low potential point to provide a plurality of first reference potentials including potentials at the high and low potential points and put in a first descending order, the first reference potentials paired adjacent to each other in the first order defining upper and lower limits of a plurality of voltage zones corresponding to the resistor groups, each of the resistor groups including a plurality of resistors connected in series for dividing a potential difference between the upper and lower limits of the corresponding voltage zone to provide a plurality of second reference potentials including the first reference potentials and put in a second descending order, the second reference potentials forming a reference potential band for each of the voltage zones corresponding thereto, a plurality of bus line groups each having a plurality of analog bus lines arranged in a third order, a plurality of potential line bands provided in one-to-one corresponding relation to the reference potential bands and each including a plurality of reference potential lines, the second reference potentials in the corresponding reference potential band being applied respectively to the reference potential lines in the second order, first A-D conversion means for comparing the sample signal with the first reference potentials to provide a first conversion result specifying as a corresponding zone one specific voltage zone having the upper and lower limits between which the sample signal falls, a plurality of switch groups provided in corresponding relation to the voltage zones, and second A-D conversion means for comparing the sample signal with the second reference potentials to provide a second conversion result specifying level relation between the sample signal and the second reference potentials, each of the reference potential bands including a high potential group having the second reference potentials of relatively high levels and a low potential group having the second reference potentials of relatively low levels, each of the potential line bands including a high potential line group and a low potential line group, the high potential group being applied to the high potential line group, the low potential group being applied to the low potential line group, each of the switch groups including a plurality of switches disposed on the reference potential lines and the analog bus lines for connecting the reference potential lines in the corresponding potential line band to the analog bus lines with the second and third orders associated with each other, the switches only in one of the switch groups corresponding to the specific voltage zone specified by the first A-D conversion means as the corresponding zone being permitted to conduct, the switches disposed on each of the analog bus lines being smaller in number than the reference potential bands.

In another aspect of the present invention, a series-parallel A-D converter comprises an input terminal receiving a sample signal to be A-D converted, a high potential point, a low potential point, a plurality of resistor groups connected in series between the high potential point and the low potential point for dividing a potential difference between the high potential point and the low potential point to provide a plurality of first reference potentials including potentials at the high and low potential points and put in a first descending order, the first reference potentials paired adjacent to each other in the first order defining upper and lower limits of a plurality of voltage zones corresponding to the resistor groups, each of the resistor groups including a plurality of resistors connected in series for dividing a potential difference between the upper and lower limits of the corresponding voltage zone to provide a plurality of second reference potentials including the first reference potentials and put in a second descending order, the second reference potentials forming a reference potential band for each of the voltage zones corresponding thereto, the reference potential bands being divided into first and second reference potential bands whose ranks are discontinuous with each other in the first order, each of the reference potential bands including a high potential group having the second reference potentials of relatively high levels and a low potential group having the second reference potentials of relatively low levels, a bus line group including a plurality of analog bus lines arranged in a third order, first A-D conversion means for comparing the sample signal with the first reference potentials to provide a first conversion result specifying as a corresponding zone one specific voltage zone having the upper and lower limits between which the sample signal falls, a switch band including a plurality of switches disposed on the reference potential lines and the analog bus lines for connecting the reference potential lines to the analog bus lines, second A-D conversion means for comparing the sample signal with the second reference potentials to provide a second conversion result specifying level relation between the sample signal and the second reference potentials, and error correction means for correcting the first conversion result as a function of the second conversion result to provide a third conversion result, the switches disposed on each of the analog bus lines being smaller in number than the reference potential bands.

Preferably, the series-parallel A-D converter further comprises a plurality of potential line bands provided in one-to-one corresponding relation to the reference potential bands and each including a plurality of reference potential lines, the second reference potentials in the corresponding reference potential band being applied respectively to the reference potential lines in the second order, each of the potential line bands including a high potential line group to which the high potential group is applied and a low potential line group to which the low potential group is applied.

Preferably, the bus line group is divided into first, second, third and fourth bus line groups from the highest rank in the third order; the potential line bands are divided into first and second potential line bands corresponding to the first and second reference potential bands, respectively; and the switches connect the high and low potential line groups in one of the first potential line bands of an intermediate rank in the first order to the second and third bus line groups, respectively, the low potential line group in the second potential line band of a rank higher by one in the first order than the rank of the one first potential line band to the first bus line group, and the high potential line group in the second potential line band of a rank lower by one in the first order than the rank of the one first potential line band to the fourth bus line group.

Preferably, permitted to conduct when one of the voltage zones of the intermediate rank in the first order is specified as the corresponding zone are: the switches disposed on the high potential line group in one of the potential line bands corresponding to the one voltage zone, the switches disposed on the low potential line group in the one potential line band, the switches disposed on the low potential line group in the potential line band of a rank higher by one in the first order than the rank of the one potential line band, and the switches disposed on the high potential line group in the potential line band of a rank lower by one in the first order than the rank of the one potential line band.

Preferably, the bus lines are arranged in order of difference between the ranks of the bus lines paired adjacent to each other in the third order.

The provision of the plurality of bus line groups reduces the reference potential bands with respect to each bus line group and, accordingly, the number of switches connected to each analog bus line. The variation in low-order reference potentials in each bus line group is minimized.

The switches connecting the reference potential lines to the analog bus lines when the voltage zone corresponding to the second potential band is the corresponding zone also serve as the switches connecting the reference potential lines to the analog bus lines when the voltage zone corresponding to the first potential line band is the corresponding zone. The number of switches connected to each analog bus line is reduced.

Furthermore, the arrangement of the analog bus lines in order of the difference in rank in the first order between the adjacent analog bus lines enables the length of wires led about to be shortened in the second A-D conversion means.

As described hereinabove, since the number of switches connected to each analog bus line is reduced, the parasitic capacitance of each analog bus line is decreased and the settling time of the low-order reference potentials applied thereto is shortened. This provides for the high-speed operation of the A-D converter.

In particular, the provision of the plurality of bus line groups reduces the reference potential bands with respect to each bus line group, so that the variation in the low-order reference potentials in each bus line group is minimized.

The length of wires led about is shortened in the second A-D conversion means to decrease the capacitance thereof.

An object of the present invention is to provide an A-D converter that operates at high speeds by shortening a settling time of low-order reference potentials outputted from a reference potential generating circuit.

These and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
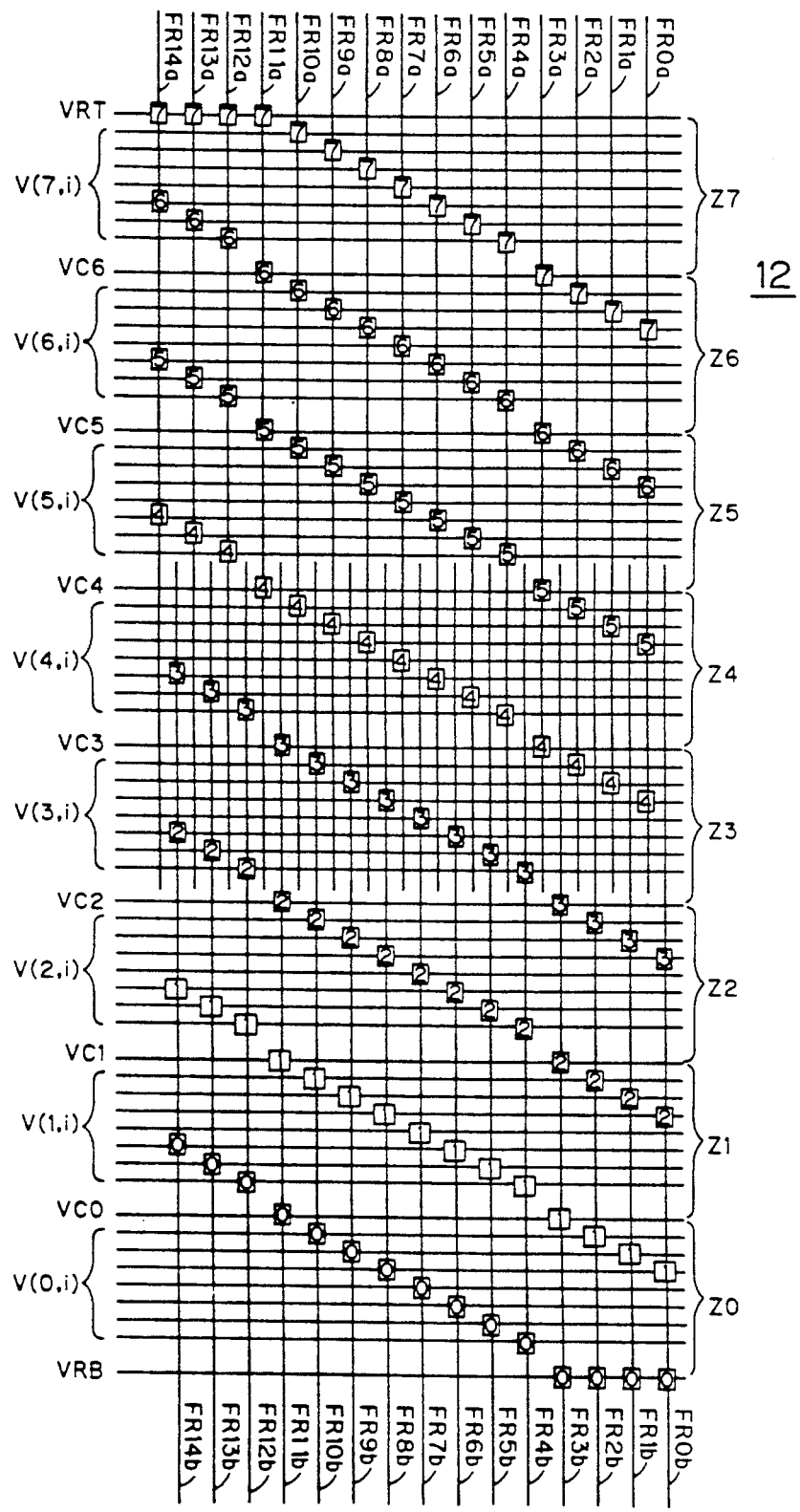
FIG. 1 illustrates a first preferred embodiment according to the present invention.

FIG. 1 is a diagram of a switch matrix 12 for a reference potential generating circuit of a first preferred embodiment according to the present invention. A potential difference between high and low potential references VRT and VRB is divided into 65 levels of low-order reference potentials (VRT, V(j,i), VC0 to VC6 (where i=0, 1, ..., 6, j=0, 1, ..., 7)) by resistors r (not shown) included in resistor groups R0 to R7 connected in series in the same fashion as the prior art. The low-order reference potentials VC0 to VC6, VRT, VRB also serve as the high-order reference potentials. The low-order reference potentials are applied to reference potential lines extending horizontally in FIG. 1 in potential level order and are separated into eight voltage zones, each (Z0-Z7) corresponding to a high-order reference potential as indicated by Expressions (1) to (3). In FIG. 1, [0], [1], [2], [3], [4], [5], [6], [7] represent switches which turn on when a sample signal potential falls in voltage zones Z0, Z1, Z3, Z4, Z5, Z6, Z7 as a result of high-order A-D conversion, respectively.

The switches indicated by [4], [5], [6], [7] are connected to analog bus lines FR0a to FR14a and the switches indicated by [0], [1], [2], [3] are connected to analog bus lines FR0b to FR14b. Only four switches, which are one-half of the conventional eight switches, are connected to each analog bus line, so that parasitic capacitance and, accordingly, settling time are reduced.

Figure 16:
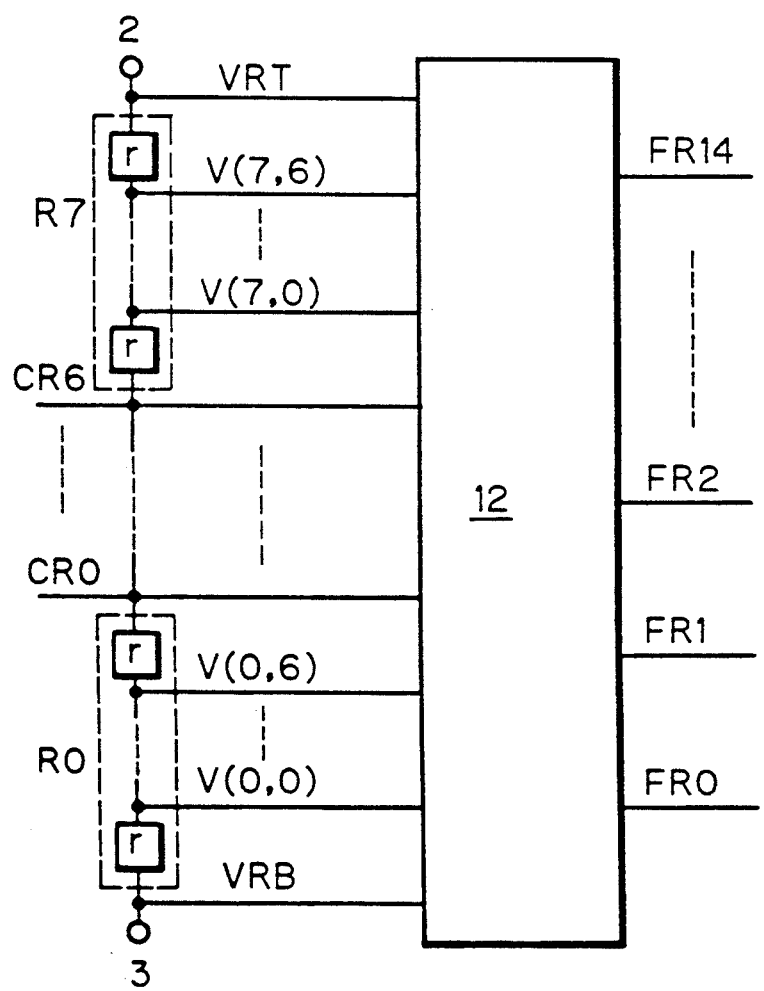
FIG. 16 is a diagram of a conventional reference potential generating circuit.
Figure 17:
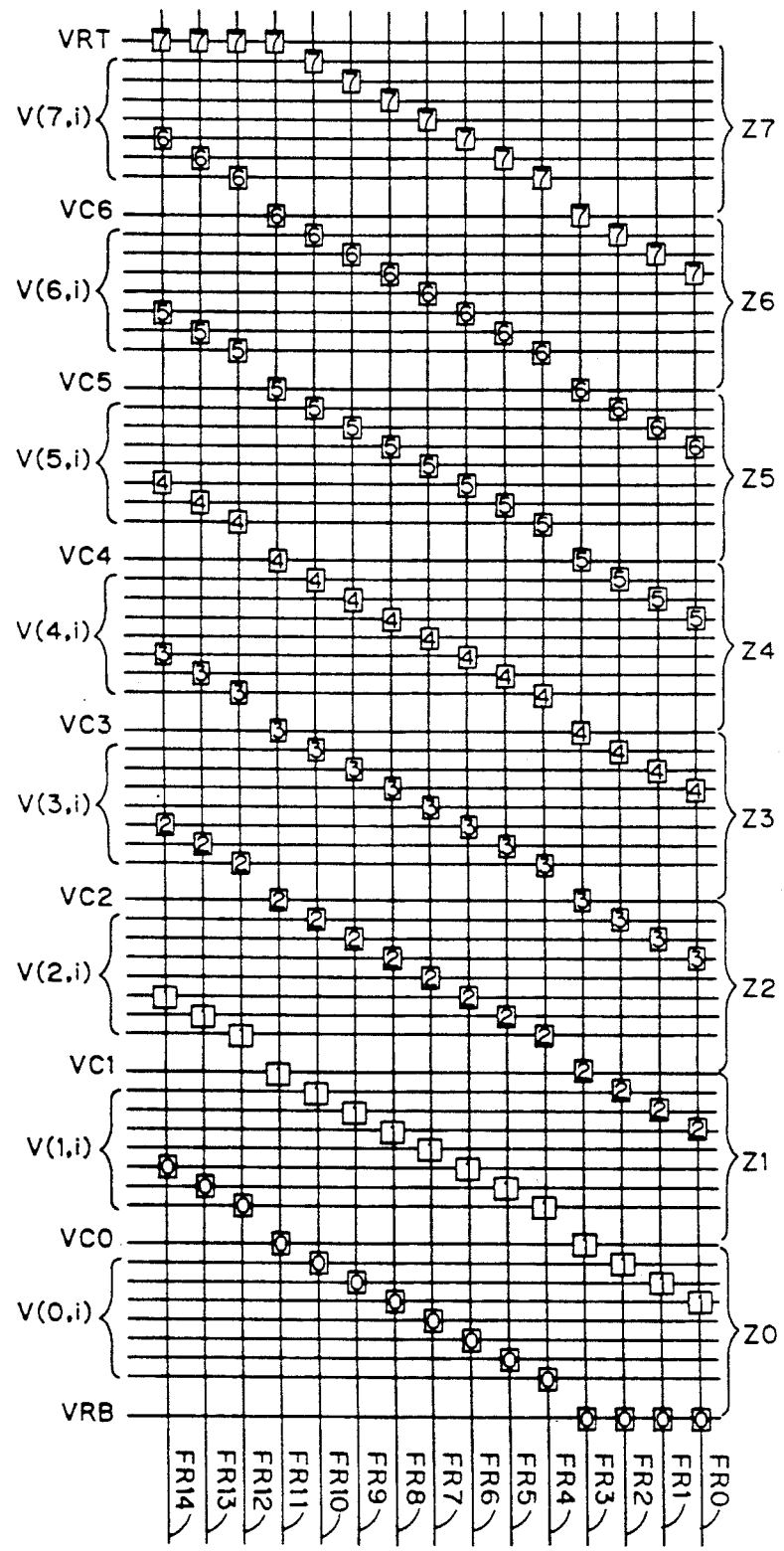
FIG. 17 illustrates a prior art.
Figure 18:
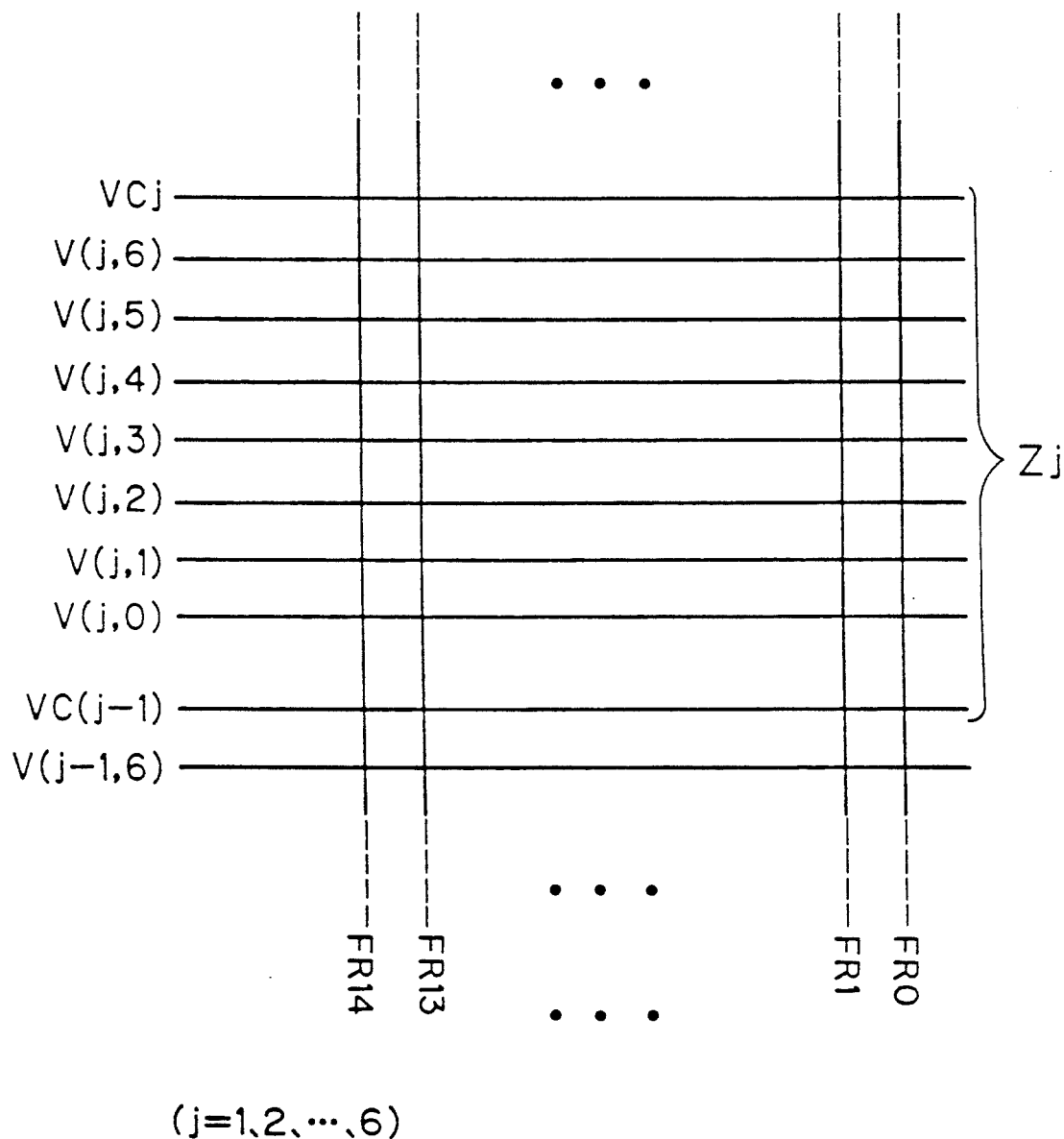
FIG. 18 illustrates the first preferred embodiment according to the present invention.

When a voltage Vref (VRT=Vref) is applied to a terminal 2 (FIG. 16) and a terminal 3 is grounded (VRB=0), a potential of only about Vref/2 or more is applied to the analog bus lines FRka and a potential of only about Vref/2 or less is applied to the analog bus lines FRkb. Thus the variation in low-order reference potentials applied to each of the analog bus lines due to the sample signal is one-half of that of the prior art. The number of switches connected to each analog bus line and the maximum level of potential variation are reduced to half by providing two groups of analog bus lines. In general, the provision of n analog bus line groups permits the number of switches connected to each analog bus line and the maximum level of potential variation to be reduced to 1/n.

A reference potential generating circuit 1 includes the switch matrix 12 having such arrangement and the resistor groups R0 to R7. The series-parallel A-D converter of FIG. 15 operates as described below in this case.

The sample signal when inputted to a terminal 5 is compared with the high-order reference potentials VC0 to VC6 so that a high-order A-D conversion result 33 is provided. The high-order reference potentials VC0 to VC6 are provided by dividing the potential difference between the high and low potential references VRT and VRB by the resistor groups R0 to R7. The high-order reference potentials VC0 to VC6 are applied to reference potential lines CR0 to CR6, respectively, and high-order voltage comparators CC0 to CC6 compare the sample signal potential with the high-order reference potentials VC0 to VC6. A high-order encoder 6 judges which one of the voltage zones Z0 to Z7 the sample signal belongs to, to provide a control signal 32 and the high-order A-D conversion result 33 which is a 3-bit signal. The operations in the high-order voltage comparators CC0 to CC6 will be described later.

The control signal 32 controls the switches. When it is judged that the sample signal potential falls in the voltage zone Z3, the switches indicated by [3] of FIG. 1 turn on. At this time, only the analog bus lines FR0b to FR14b are connected, and the analog bus lines FR0a to FR14a are disconnected. The switches indicated by [3] also apply potentials other than the low-order reference potentials classified in the voltage zone Z3 to the analog bus lines FR0b to FR3b and FR11b to FR14b. For correction of the high-order A-D conversion result, the low-order reference potentials adjacent the voltage zone Z3 are also applied to the low-order voltage comparators FC0 to FC3 and FC11 to VC14.

The analog bus lines FR0a to FR14a and FR0b to FR14b are connected to low-order voltage comparators FC0 to FC14, respectively. Inasmuch as the switches indicated by [3] are on, potentials V(2, 4), V(2, 5), V(2, 6), VC2, V(3, i) (where i=0, 1, ..., 6), VC3, V(4, 0), V(4, 1), V(4, 2) are inputted to the low-order voltage comparators FC0 to VC14, respectively. The sample signal potential is compared with the potentials and the result is given as a low-order A–D conversion result to a terminal 9 by a low-order encoder 8.

Figure 2:
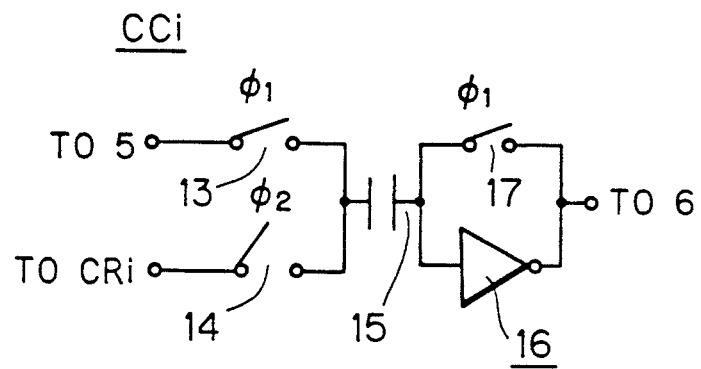
FIG. 2 is a diagram of a high-order voltage comparator CCi.
Figure 3:
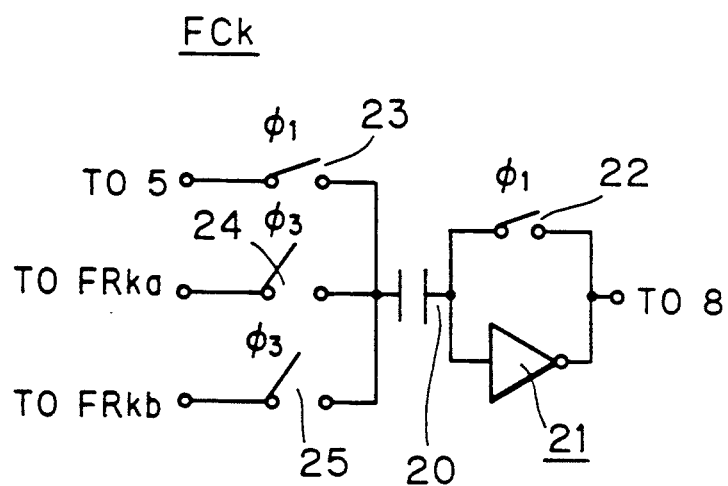
FIG. 3 is a diagram of a low-order voltage comparator FCk.

FIGS. 2 and 3 are diagrams of the voltage comparators. FIG. 2 shows the high-order voltage comparator CCi and FIG. 3 shows the low-order voltage comparator FCk (where $i = 0, 1, \ldots, 6$, $k = 0, 1, \ldots, 14$).

Referring to FIG. 2, the input of the high-order voltage comparator CCi includes a switch 13 that is on/off controlled by a clock signal $\phi 1$ and a switch 14 that is on/off controlled by a clock signal $\phi 2$. One terminal of the switch 13 is connected to the terminal 5, and one terminal of the switch 14 is connected to a high-order reference voltage input CRi. The respective other terminals of the switches 13 and 14 are connected to one terminal of a coupling capacitance 15 in common. The other terminal of the coupling capacitance 15 is connected to the input of an inverting amplifier 16. The output of the inverting amplifier 16 is fed back to the input thereof through a switch 17 that is on/off controlled by the clock signal $\phi 1$. The output of the inverting amplifier 16 is connected to the high-order encoder 6.

Referring to FIG. 3, the input of the low-order voltage comparator FCk includes a switch 23 that is on/off controlled by the clock signal $\phi 1$ and switches 24, 25 that are on/off controlled by the clock signal $\phi 3$. One terminal of the switch 23 is connected to the terminal 5. One terminal of the switch 24 is connected to the analog bus line FRka. One terminal of the switch 25 is connected to the analog bus line FRkb. The respective other terminals of the switches 23, 24, 25 are connected to one terminal of a coupling capacitance 20 in common.

The switch 24 is on while it is judged that the sample signal potential falls in the voltage zones Z4 to Z7 (that is, the sample signal has a level equal to or higher than VC3) as a result of the high-order A–D conversion and a clock signal $\phi 3$ is "1". The switch 25 is on while it is judged that the sample signal potential falls in the voltage zones Z0 to Z3 (that is, the sample signal has a level equal to or lower than VC3) as a result of the high-order A–D conversion and the clock signal $\phi 3$ is "1".

The other terminal of the coupling capacitance 20 is connected to the input of an inverting amplifier 21. The output of the inverting amplifier 21 is fed back to the input thereof through a switch 22 that is on/off controlled by the clock signal $\phi 1$. The output of the inverting amplifier 21 is connected to the low-order encoder 8.

Figure 4:
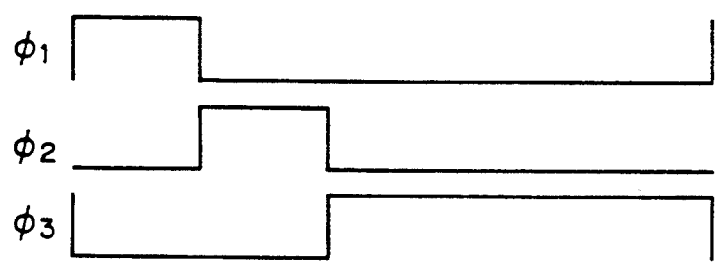
FIG. 4 is a timing chart of clock signals $\phi 1$, $\phi 2$, $\phi 3$.

The operation of the voltage comparators will be described hereinafter with reference to clock waveforms shown in FIG. 4. When the clock signals $\phi 2$ and $\phi 3$ are both "0", the switches 13, 17, 23, 22 are on the switches 14, 24, 25 are off for a period of time that the clock signal $\phi 1$ has the logical level "1" (hereinafter referred to as an "auto-zero period"). The turn-on of the switches 17 and 22 permits the input and output of the inverting amplifiers 16 and 21 to be short-circuited, whereby the input and output of the inverting amplifiers 16 and 21 are biased by a sensitive potential Vb during the auto-zero period. Thus the coupling capacitances 15 and 20 are charged by the potential of the sample signal applied through the switches 13 and 23 and the valance potential Vb of the inverting amplifiers 16 and 21 for this period of time.

When the clock signal $\phi 1$ has the logical level "0" and the clock signal $\phi 2$ has the logical level "1", the switches 13, 17, 23, 22 are off and the switch 14 is on. The switches 24, 25 are held "off" since the clock signal $\phi 3$ is still "0". The turn-off of the switches 17, 22 permits the inputs of the inverting amplifiers 16, 21 to have an infinite impedance. The electric charge accumulated at the inputs of the inverting amplifiers 16, 21 during the auto-zero period is held for this period of time.

The high-order reference potential is applied in place of the sample signal to the input of the coupling capacitance 15 of the high-order voltage comparator CCi. The potential change from the sample signal to the high-order reference potential at the input of the coupling capacitance 15 causes shift from the balance potential Vb at the input of the inverting amplifier 16. The shift is amplified in the inverting amplifier 16 so that a level comparison result between the sample signal potential and high-order reference potential is outputted as a digital signal having the logical level "1" or "0" from the high-order voltage comparator CCi.

When the clock signal $\phi 2$ has the logical level "0" and the clock signal $\phi 3$ has the logical level "1", the switch 14 is off and one of the switches 24, 25 is on. Inasmuch as the clock signal $\phi 1$ is still "0", the switches 13, 17, 23, 22 are held "off". Since the switch 22 is still off, the electric charge accumulated at the input of the inverting amplifier 21 during the auto-zero period is held for this period of time.

The low-order reference potential is applied in place of the sample signal to the input of the coupling capacitance 20 of the low-order voltage comparator FCk. The potential change from the sample signal to the low-order reference potential at the input of the coupling capacitance 20 causes shift from the balance potential Vb at the input of the inverting amplifier 21. The shift is amplified in the inverting amplifier 21, so that a level comparison result between the sample signal potential and the low-order reference potential is outputted as a digital signal having the logical level "1" or "0" from the low-order voltage comparator FCk.

The switching operation in the switch matrix 12 is required for comparison in the low-order voltage comparator FCk. Thus the period that the clock signal $\phi 3$ is "1" is longer than the sum of the period that the clock signal $\phi 1$ is "1" and the period that the clock signal $\phi 2$ is "1", i.e., the period required for comparison in the high-order voltage comparator CCi.

Figure 15:
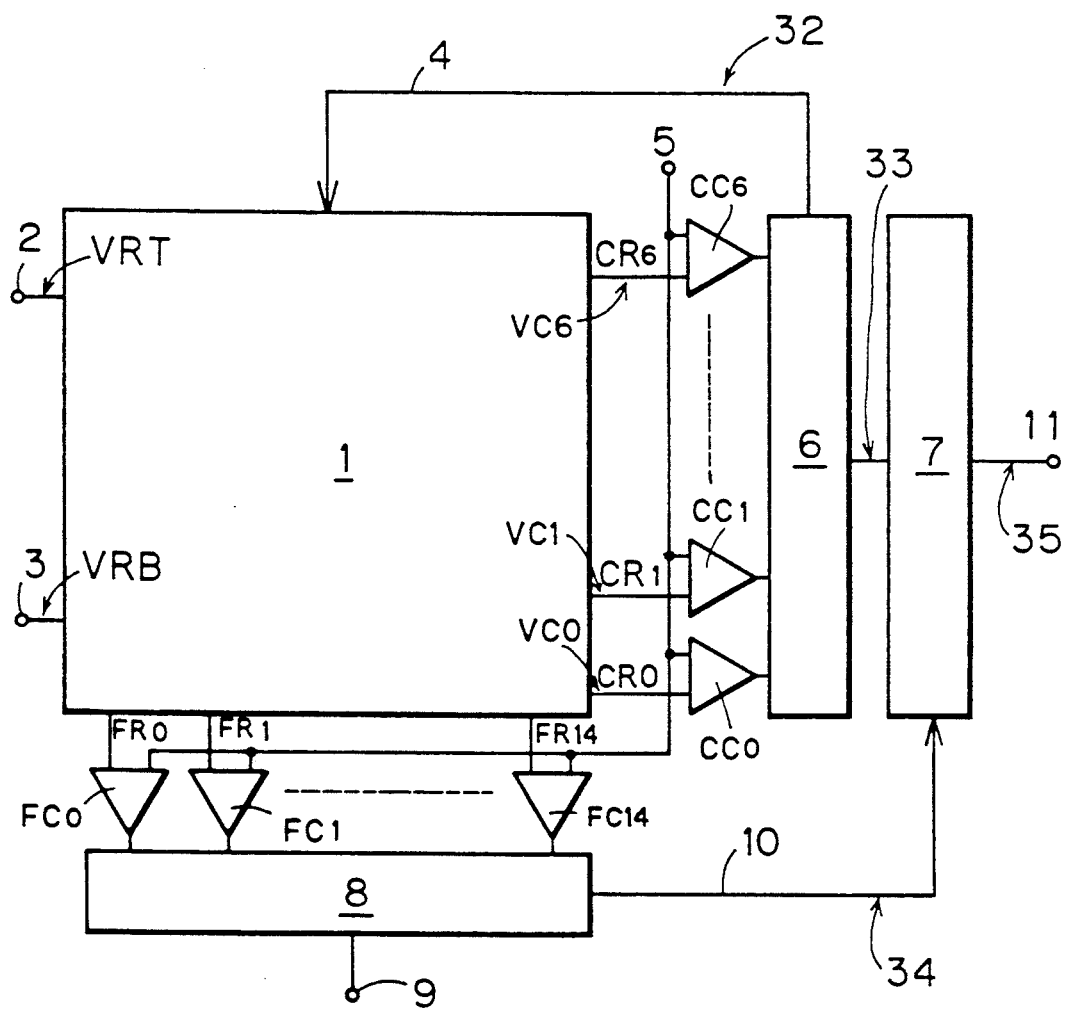
FIG. 15 is a diagram of a conventional series-parallel A-D converter.

The comparison result between the low-order reference potentials and the sample signal potential sometimes contradicts the high-order A–D conversion result 33. For example, it is judged in some cases that the sample signal potential falls in the voltage zone Z2 or Z4 as a result of the low-order A–D conversion while it is judged that the sample signal potential falls in the voltage zone Z3 as a result of the high-order A–D conversion. In such cases, the high-order A–D conversion result is corrected in an error correction circuit 7, and a corrected high-order A–D conversion result 35 is outputted to a terminal 11 (FIG. 15).

The error correction circuit 7 carries out the following processings:

(A) The high-order A–D conversion result is counted up by one when the sample signal potential lies outside a voltage range determined by the high-order A–D conversion on the higher potential side as a result of the low-order A–D conversion.

(B) The high-order A–D conversion result is counted down by one when the sample signal potential lies outside the voltage range determined by the high-order A-D conversion on the lower potential side as a result of the low-order A-D conversion.

Specifically, the low-order comparator 8 processes the outputs of the low-order voltage comparators FC0 to FC14 to transmit an error detection signal 34 composed of two bits OS, US to the error correction circuit 7 as well as the low-order A-D conversion signal to the terminal 9. The error correction circuit 7, on receipt of the error detection signal 34, carries out either the processing (A) or (B) as a function of the information of the error detection signal 34. The error detection processing and the like in the low-order comparator 8 will be described later with reference to a third preferred embodiment, and the error correction processings (A) and (B) will be described in detail in this preferred embodiment.

Outputted three bits defining the high-order A-D conversion result 33 are designated by U21, U11, U01 from the high-order side, and outputted three bits defining the corrected high-order A-D conversion result 35 are designated by U22, U12, U02 from the high-order side. When there is no contradiction between the high-order and low-order conversions, the following equations hold:

$$OS = US = 0, U22 = U21, U12 = U11, U02 = U01 \quad (5)$$

In the case of the processing (A), the following equations hold:

$$OS = 1, US = 0,$$
$$dec(U22U12U02) = dec(U21U11U01) + 1 \quad (6)$$

In the case of the processing (B), the following equations hold:

$$OS = 0, US = 1,$$
$$dec(U22U12U02) = dec(U21U11U01) - 1 \quad (7)$$

where dec represents decimalizing operation. The addition and subtraction in the processings (A) and (B) are achieved respectively by:

$$Q0\ U22U12U02 = U21U11U01 + 001 \quad (8)$$

and $$Q0\ U22\ U12\ U02 = U21\ U11\ U01 + 111 \quad (9)$$

where Q0 represents carry.

Figure 5:
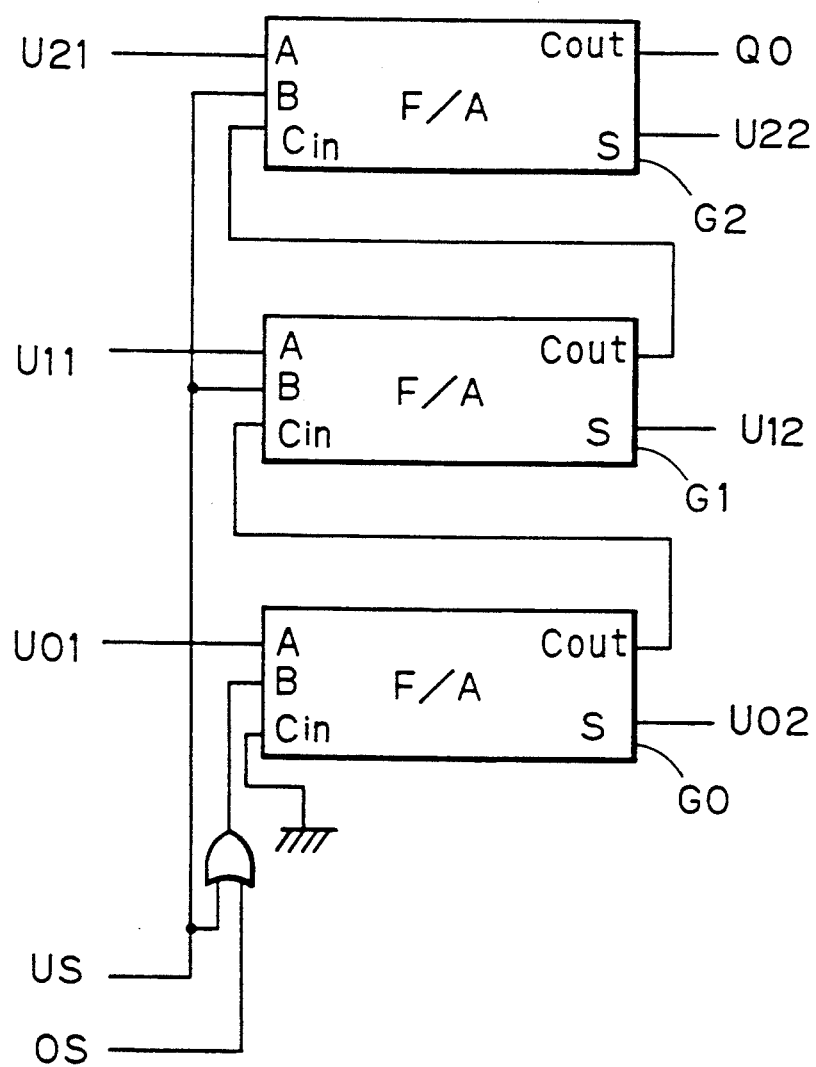
FIG. 5 is a diagram of an error correction circuit 7.

A detailed example of the error correction circuit is shown in FIG. 5. The signals of the three bits U21, U11, U01 of the high-order A-D conversion result 33 are inputted to the A inputs of full adders G2, G1, G0, respectively. The logical add of the 1-bit signal US and the 1-bit signal OS is inputted to the B inputs of the full adders G2 and G1. The carry input Cin of the full adder G0 is grounded to provide the logical level "0". The carry output Cout of the full adder G0 is connected to the carry input Cin of the full adder G1, and the carry output Cout of the full adder G1 is connected to the carry input Cin of the full adder G2. The outputs S of the full adders G0, G1, G2 and the carry output Cout of the full adder G2 output the signals U22, U12, U02 and the carry Q0, respectively. Such arrangement enables the calculations of Expressions (8) and (9).

Figure 6:
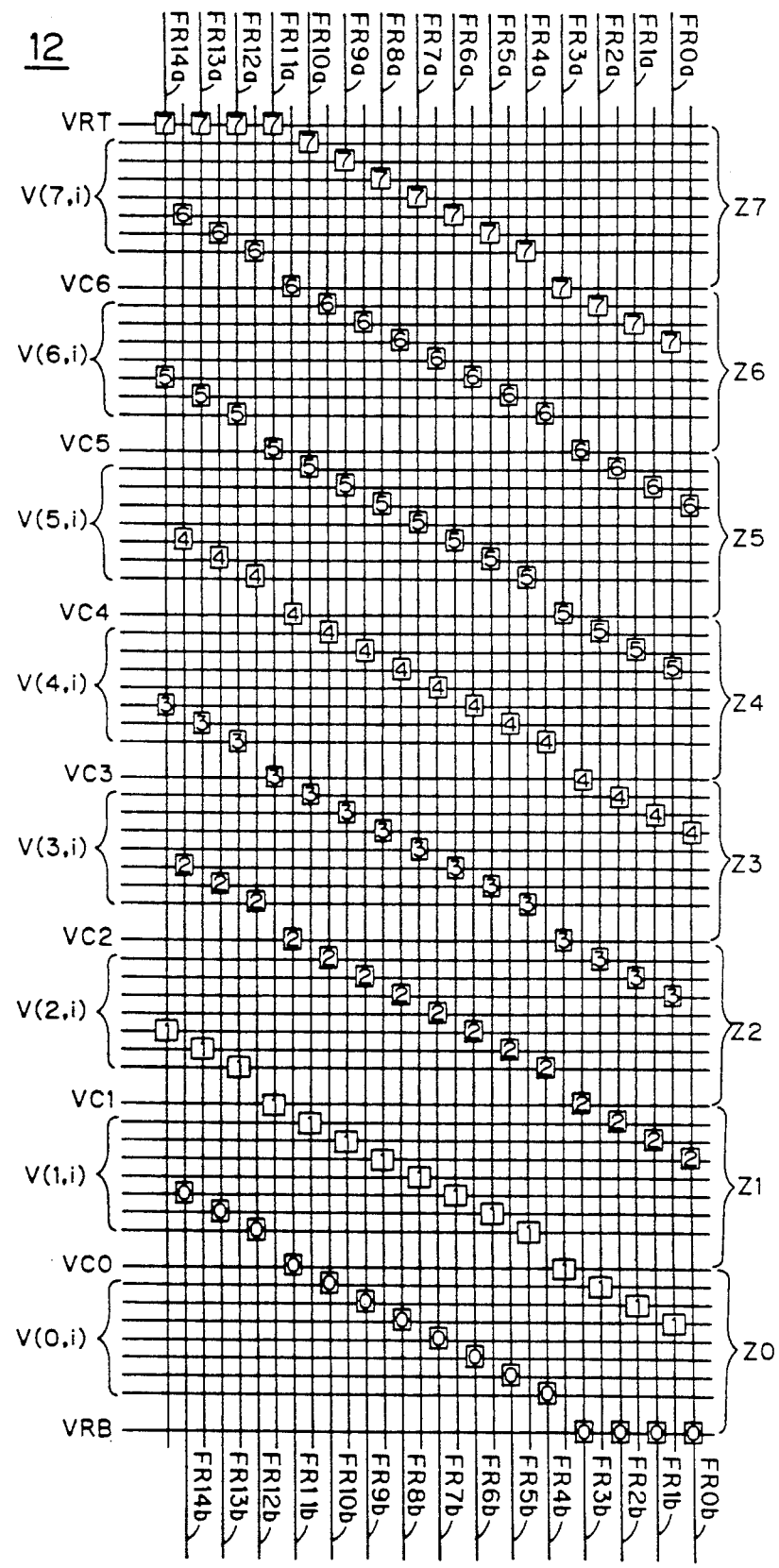
FIG. 6 illustrates a second preferred embodiment according to the present invention.

The arrangement of the switches is not limited to that of FIG. 1 for the provision of the two groups of analog bus lines. FIG. 6 shows an arrangement of the switch matrix 12 of a second preferred embodiment according to the present invention. The potential lines to which the analog bus line groups are connected are divided at the high-order reference potential VC3 serving as a boundary in the first preferred embodiment. Among the eight switch groups of FIG. 6, p-th (where p is odd) switch groups from the low potential side (the switches indicated by [0], [2], [4], [6]) are connected to the analog bus lines FRkb and q-th (where q is even) switch groups (the switches indicated by [1], [3], [5], [7]) are connected to the analog bus lines FRka to provide the similar effects. Such connection permits the number of switches connected to each analog bus line to be reduced to half as compared with the prior art, thereby achieving the reduction in parasitic capacitance and, accordingly, in settling time. Various applications of the second preferred embodiment are considered. For example, the switches indicated by [0], [1], [4], [5] may be connected to the analog bus lines FRkb while the switches indicated by [2], [3], [6], 7] are connected to the analog bus lines FRka.

The number of switches connected to each analog bus line is reduced by providing the plurality of analog bus line groups in the first and second preferred embodiments. However, the number of switches may be reduced using one bus line group having the analog bus lines the number of which is equal to the number of low-order reference potentials (fifteen herein) by suitably controlling the switches by means of the control signal 32.

Figure 7:
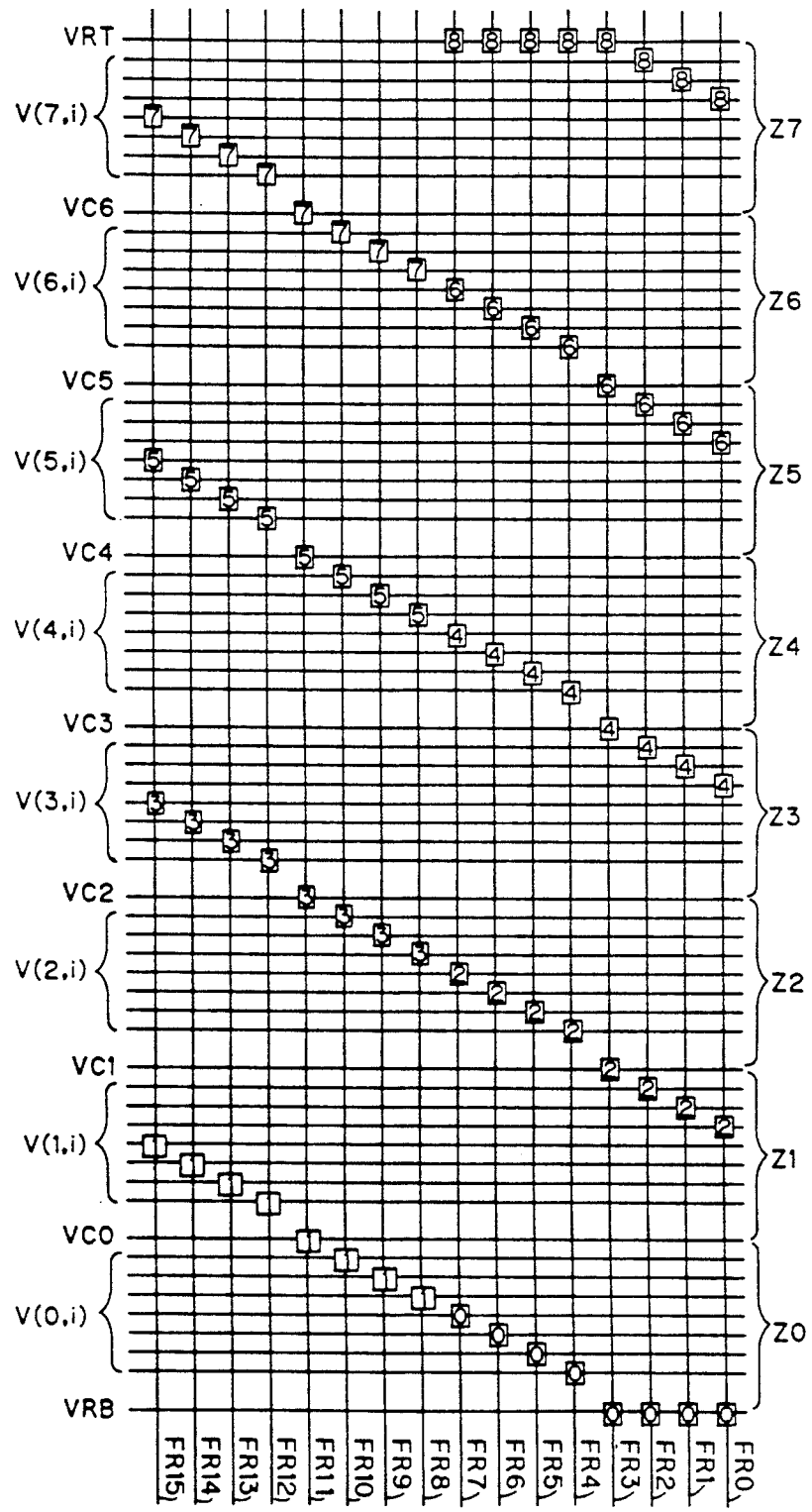
FIG. 7 illustrates a third preferred embodiment according to the present invention.

FIG. 7 shows an arrangement of the switch matrix 12 of a third preferred embodiment according to the present invention. Four or five switches, which are fewer than the conventional seven or eight switches, are connected to each analog bus line, so that the parasitic capacitance of the analog bus lines are reduced and high-speed operation of the reference potential generating circuit 1 is achieved.

The operation of the switches of FIG. 7 will be discussed below. The switches indicated by [0] and [1] turn on when it is judged that the sample signal potential falls in the voltage zone Z0 as a result of the high-order A-D conversion. The switches indicated by [1] and [2] turn on when the sample signal potential falls in the voltage zone Z1. The switches indicated by [2] and [3] turn on when the sample signal potential falls in the voltage zone Z2. The switches indicated by [3] and [4] turn on when the sample signal potential falls in the voltage zone Z3. The switches indicated by [4] and [5] turn on when the sample signal potential falls in the voltage zone Z4. The switches indicated by [5] and [6] turn on when the sample signal potential falls in the voltage zone Z5. The switches indicated by [6] and [7] turn on when the sample signal potential falls in the voltage zone Z6. The switches indicated by [7] and [8] turn on when the sample signal potential falls in the voltage zone Z7.

In such switch matrix 12, the low-order reference potentials for error correction are applied to not only the analog bus lines FR0 to FR3 and FR12 to FR15. The low-order reference potentials for error correction are applied to the analog bus lines FR0 to FR3 and FR12 to FR15 when the sample signal potential falls in one of the voltage zones Z0, Z2, Z4, Z6, and are applied to the analog bus lines FR4 to FR11 when the sample signal potential falls in one of the voltage zones Z1, Z3, Z5, Z7.

In the former case, the lowest voltage is applied to the analog bus line FR0 and the highest voltage is applied to the analog bus line FR15 similarly to the prior art case. In the latter case, the lowest voltage is applied to the analog bus line FR8 and the highest voltage is applied to the analog bus line FR7. That is, there are two forms of applications of the low-order reference voltages to the analog bus lines in accordance with the result of the high-order A-D conversion.

Figure 8:
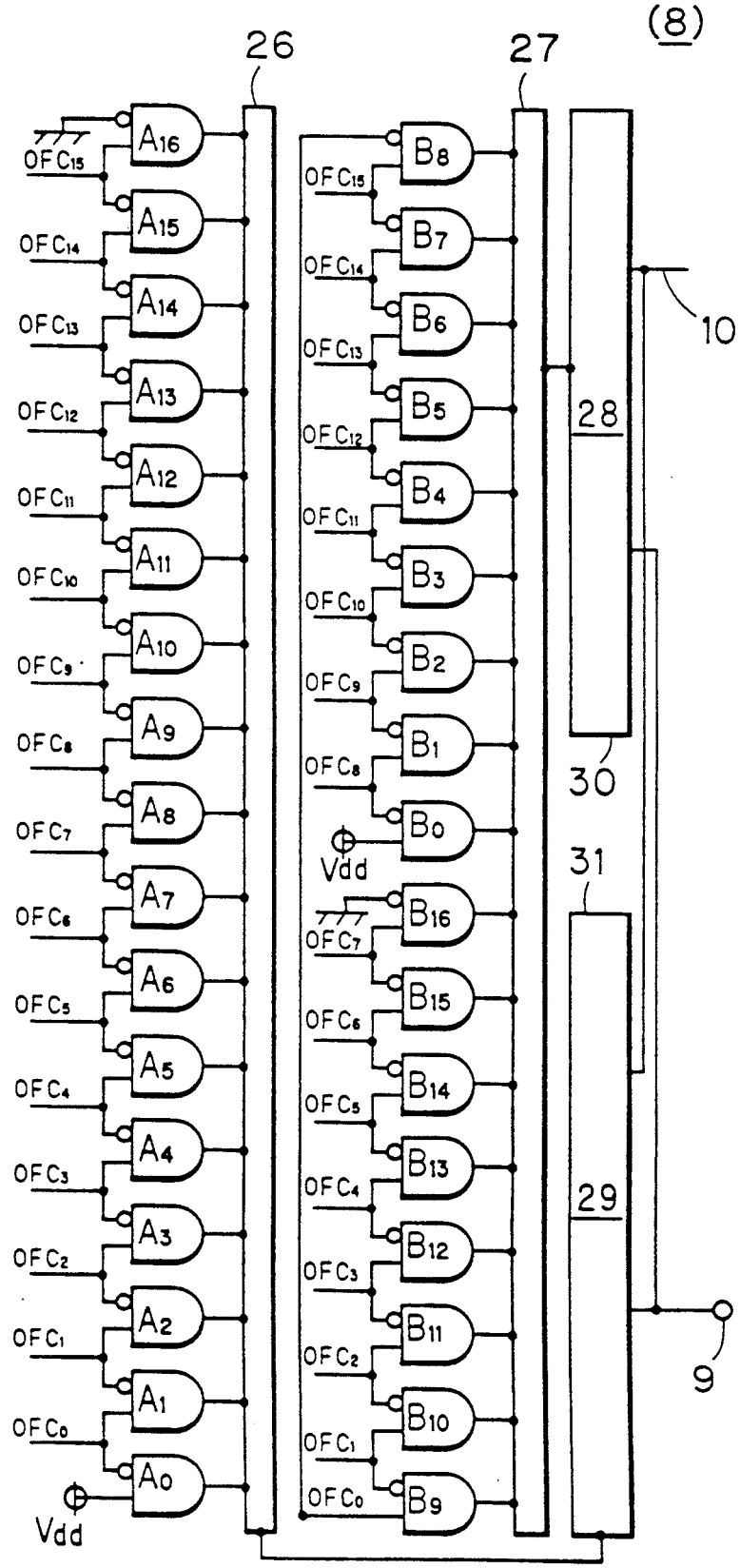
FIG. 8 is a diagram of a low-order encoder 8.

In FIG. 8, there is shown an internal structure of the low-order encoder 8 adapted for the two forms of applications. The low-order encoder 8 includes 2-input AND gates A0 to A16, B0 to B16, detectors 26, 27 and switch circuits 28, 29. The outputs OFCk of the low-order voltage comparators FCk (k=0 to 15) are connected to the non-inverting inputs of the AND gates A(k+1) and to the inverting inputs of the AND gates Ak. The outputs OFCk are also connected to the non-inverting inputs of the AND gates B(k−7) and to the inverting inputs of the AND gates B(k−8) (where k>7), and are connected to the non-inverting inputs of the AND gates B(k+9) and to the inverting inputs of the AND gates B(k+8) (where k<8, although only the inverting input of the AND gate B8 is connected to the output OFC0). The non-inverting inputs of the AND gates A0 and B0 are connected to a power supply voltage Vdd, and the inverting inputs of the AND gates A16 and B16 are grounded.

The outputs of the AND gates A0 to A16, B0 to B16 are inputted to the detectors 26, 27, respectively. The outputs of the detectors 26, 27 are inputted to the switch circuits 28, 29. The outputs of the switch circuits 28, 29 are connected in common to a signal line 10 outputting the error detection signals US and OS and to the terminal 9 outputting low-order A-D conversion signals of three bits D2, D1, D0. Connection between the detection circuits 26, 27 and the signal line 10 and terminal 9 connected in common is controlled through control signal input terminals 30, 31.

Figure 9:
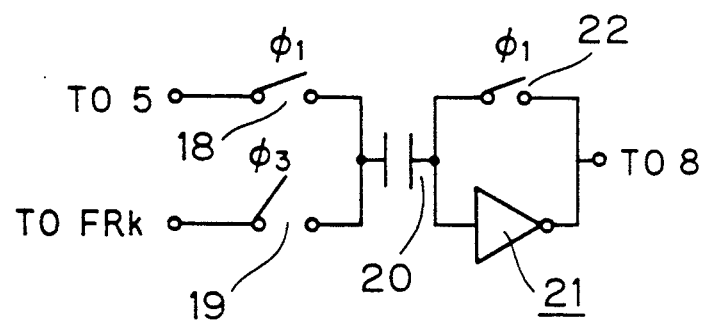
FIG. 9 is a diagram of the low-order voltage comparator FCk.

An internal structure of the low-order voltage comparator FCk (k=0 to 15) is shown in FIG. 9. The input of the low-order voltage comparator FCk includes a switch 18 that is on/off controlled by the clock signal $\phi 1$ and a switch 19 that is on/off controlled by the clock signal $\phi 3$. One terminal of the switch 18 is connected to the terminal 5, and one terminal of the switch 19 is connected to the analog bus line FRk. The respective other terminals of the switches 18 and 19 are connected to one terminal of the coupling capacitance 20 in common.

The other terminal of the coupling capacitance 20 is connected to the input of the inverting amplifier 21. The output of the inverting amplifier 21 is fed back to the input thereof through the switch 22 that is on/off controlled by the clock signal $\phi 1$. The output of the inverting amplifier 21 is connected to the low-order encoder 8.

The switch 19 is equivalent to the interlocked switches 24, 25 of the low-order voltage comparator FCk of FIG. 3. The connection of the analog bus line FRk in place of the analog bus lines FRka and FRkb to the one terminal of the switches 24, 25 permits the same operation as the structure of FIG. 9. Since the same high-order voltage comparator CCi as those of the first and second preferred embodiments are used in the third preferred embodiment, the switches 18, 19 are opened and closed in response to the clock signals $\phi 1$, $\phi 2$, $\phi 3$ of FIG. 4.

The operation of the low-order encoder 8 will be discussed below. The output of the switch matrix 12 of FIG. 7, that is, the low-order reference potentials appearing at the analog bus lines are as follows:

(a) When the sample signal potential falls in the voltage zone $Z2h$ (h=0 to 3) as a result of the high-order A-D conversion, the lowest voltage is applied to the analog bus line FR0 and the voltages to be applied to the analog bus lines FR1, FR2, ... grow higher in this order until the highest voltage is applied to the analog bus line FR15.

(b) When the sample signal potential falls in the voltage zone $Z(2h+1)$ as a result of the high-order A-D conversion, the lowest voltage is applied to the analog bus line FR8 and the voltages to be applied to the analog bus lines FR9, FR10, ..., FR15, FR0, FR1, ... grow higher in this order until the highest voltage is applied to the analog bus line FR7.

It is assumed that the sample signal potential falls in the voltage zone $Z2h$ (h=0 to 3), for example, between the low-order reference potentials V(2, 1) and V(2, 2) as a result of the high-order A-D conversion. The control signal 32 makes the switches indicated by [2] and [3] turn on (FIG. 7). The potentials at the analog bus lines FR0 to FR5 are lower than the sample signal potential and the potentials at the analog bus lines FR6 to FR15 are higher than the sample signal potential. The low-order voltage comparators FCk (k=0 to 15) (FIG. 15) compare the sample signal potential with the low-order reference potentials or the potentials at the analog bus lines to output the comparison result. The outputs OFC0 to OFC5 of the low-order voltage comparators are "1" and the outputs OFC6 to OFC15 thereof are "0". Since the AND gates Ak (k=0 to 16) implement the logic operation of OFCk·OFC(k−1) (where OFC16="0" and OFC(−1)="1"), only the output of the AND gate A6 is "1" (FIG. 8). The outputs of the AND gates Ak are used as address signals of the detector 26 and a desired code is outputted from the detector 26. The AND gates Ak function as a decoder for generating the address signals of the detector 26 from the outputs of the voltage comparators FC0 to FC15.

It is assumed that the sample signal potential falls in the voltage zone $Z(2h+1)$ (h=0 to 3), for example, between the low-order reference potentials V(3, 1) and V(3, 2) as a result of the high-order A-D conversion. The switches indicated by [3] and [4] turn on as a function of the high-order A-D conversion result. The potentials at the analog bus lines FR8 to FR13 are lower than the sample signal potential and the potentials at the other analog bus lines are higher than the sample signal potential. The outputs OFC8 to OFC13 of the low-order voltage comparators are "1" and the outputs OFC14, OFC15, OFC0 to OFC7 thereof are "0". When these outputs are inputted to the AND gates Ak (k=0 to 16), the outputs of the AND gates A0 and A14 are both "1". The detector 26 is multi-addressed, resulting in errors. When these outputs are inputted to the AND gates B0 to B15, only the output of the AND gate B6 is "1" so that the code is outputted correctly. Conversely, when the sample signal potential falls in the voltage zone $Z2h$ (h=0 to 3) as a result of the high-order A-D conversion, the AND gates B0 to B15 do not operate correctly as a decoder.

It is apparent from the foregoing description that the AND gates Ak generate the address signals correctly when the sample signal potential falls in the voltage zone $Z2h$ as a result of the high-order A-D conversion and the AND gates Bk generate the address signals correctly when the sample signal potential falls in the voltage zone $Z(2h+1)$. Accordingly, the detector 26 outputs the code correctly in the former case, and so does the detector 27 in the latter case. The outputs of the detectors 26, 27 are outputted through the switch circuits 28, 29, respectively. The switch circuits 28, 29 are operative to selectively output the correct result of the low-order A-D conversion by a detection control signal to be applied to the terminals 30, 31.

The control signal 32 outputted from the high-order encoder 6 may be employed as the detection control signal. For example, the least significant bit of the control signal 32, if binary coded, may be used as the detection control signal. When the sample signal potential falls in the voltage zone $Z(2h+1)$ as a result of the high-order A-D conversion, the least significant bit is "1". This bit is applied to the terminal 31, and the inverted signal thereof is applied to the terminal 30. The switch circuits 28, 29 should be operative to give the contents of the detectors 26, 27 to the terminal 9 and the signal line 10, respectively, on receipt of the signal "1".

Figure 10:
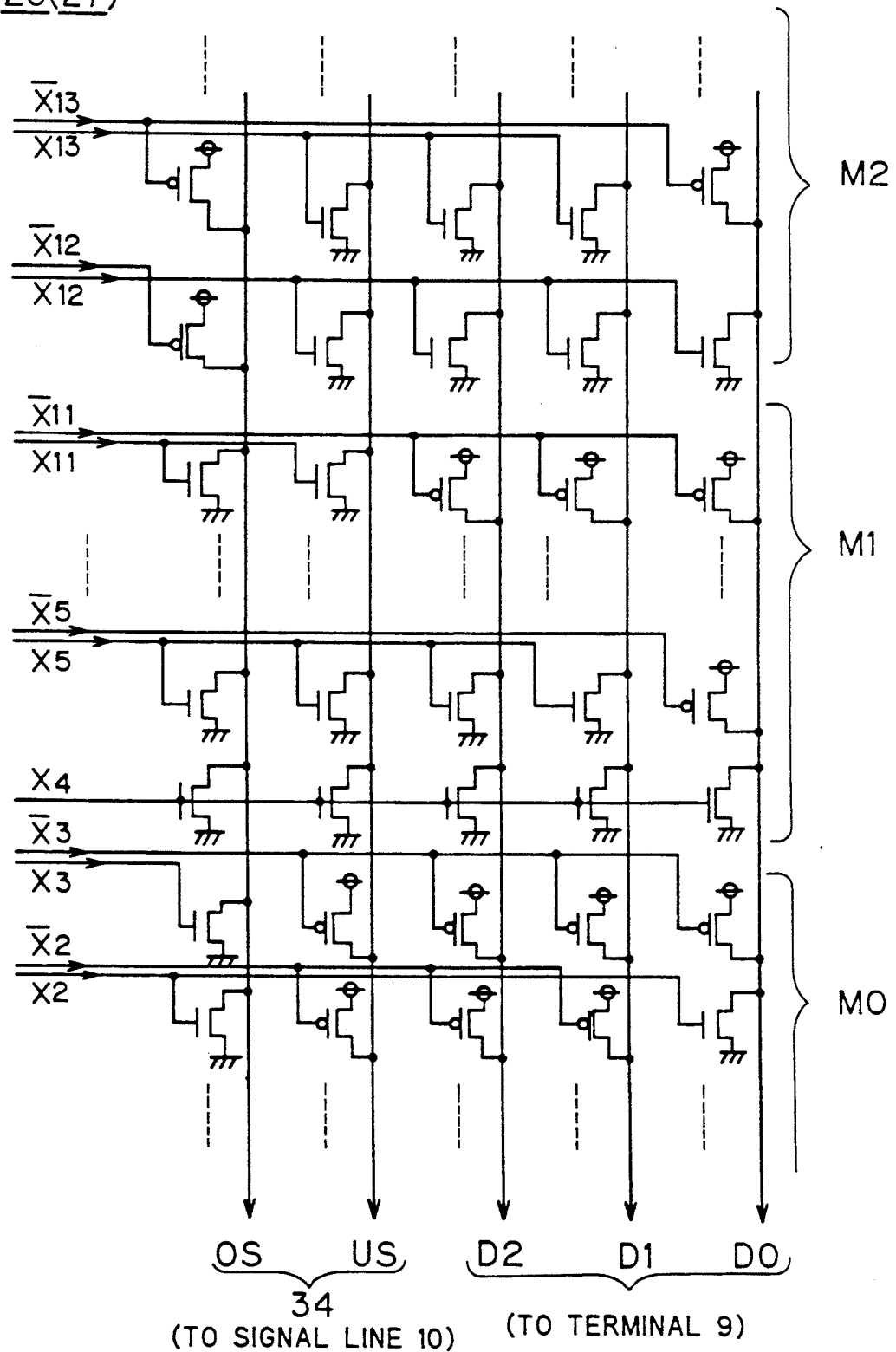
FIG. 10 is a diagram of a switch circuit 26 (27)

FIG. 10 shows an internal structure of the detector 26. Signals $Xk$ and $\overline{X}k$ are the output signal of the AND gate Ak and the inverted signal thereof, respectively. The detector 27 has the same internal structure of FIG. 10 wherein the signals $Xk$ and $\overline{X}k$ are the output signal of the AND gate Bk and the inverted signal thereof, respectively. The same operation is performed in either detector, and only the operation of the detector 26 will be described below.

The signals $Xk$ and $\overline{X}k$ ($k=0$ to 4) are attributed to the reference potentials for error correction in the case (A), and the signals $Xk$ and $\overline{X}k$ ($k=12$ to 15) are attributed thereto in the case (B). A transistor array M0 copes with the generation of underscale errors, and a transistor array M2 copes with the generation of overscale errors. The transistors connected to the line outputting the error detection signal OS (the leftmost vertical line of FIG. 10) are NMOS transistors in the transistor array M0 and are PMOS transistors in the transistor array M2. The transistors connected to the line outputting the error detection signal US (the second vertical line from the left) are PMOS transistors in the transistor array M0 and are NMOS transistor in the transistor array M2. The error detection signals US, OS are provided respectively from the transistor arrays M0, M2 and are used for the error correction described with reference to the first preferred embodiment. The error detection signals US, OS are transmitted to the signal line 10.

The signals $Xk$ and $\overline{X}k$ ($k=4$ to 11) indicate the result of the low-order A-D conversion. All of the transistors connected to the lines outputting the error detection signals OS and US in a transistor array M1 are NMOS transistors. When the high-order A-D conversion result coincides with the low-order A-D conversion result, the error detection signals OS and US are both "0". Since PMOS and NMOS transistors are connected to the lines outputting the low-order A-D conversion result to the terminal 9 (three right-hand vertical lines of FIG. 10) in accordance with the weighting k of the signals $Xk$ and $\overline{X}k$, the transistor array M1 provides the normal low-order A-D conversion result including the signals of three bits D2, D1, D0 arranged from the high-order side, and the result is applied to the terminal 9.

For connecting the output OFC0 of the low-order voltage comparator to the AND gates B8 and B9, a long portion of wiring is needed in the arrangement of the low-order encoder 8 of FIG. 8 since the AND gates B8 and B9 are distantly spaced apart from each other. The capacitance of the portion causes the operating speed to be reduced. To avoid such situation, the arrangement of the bus lines in the switch matrix 12 should be devised such that the low-order reference potentials having approximate levels are applied to adjacent analog bus lines, whether the sample signal potential falls in the voltage zone Z2h or $Z(2h+1)$.

Figure 11:
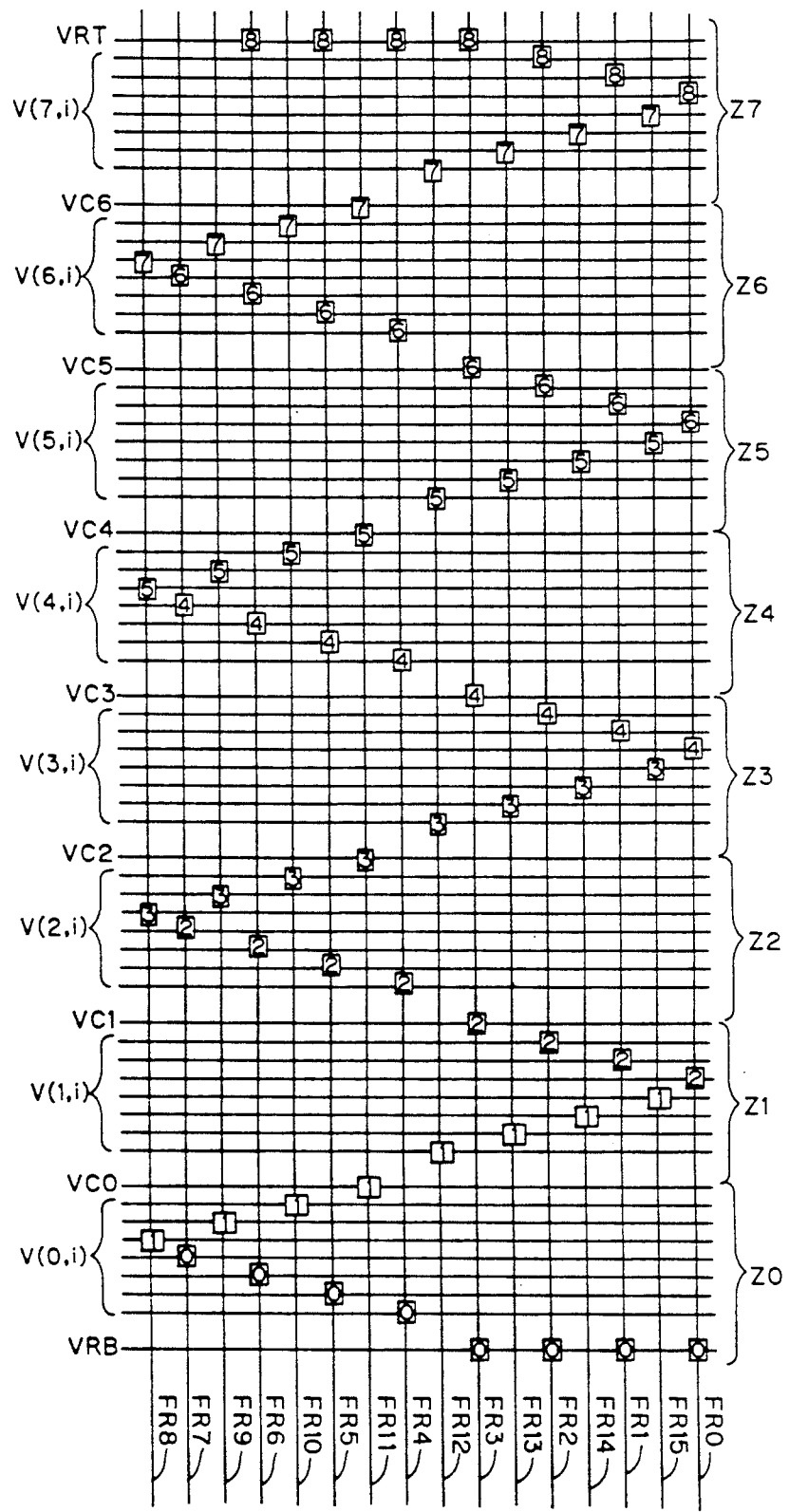
FIG. 11 illustrates a fourth preferred embodiment according to the present invention.

FIG. 11 shows an arrangement of the switch matrix 12 of a fourth preferred embodiment according to the present invention. The switches indicated by various symbols in the fourth preferred embodiment function in the same fashion as those of the third preferred embodiment. The fourth preferred embodiment is different from the third preferred embodiment in arrangement of the analog bus lines. Although the analog bus lines FR0 to FR15 are arranged in sequential order from the right in the third preferred embodiment, the analog bus lines FR0 to FR7 arranged in sequential order from the right and the analog bus lines FR8 to FR15 arranged in sequential order from the left are designed to alternate with each other, respectively. In other words, the analog bus lines are arranged in order of the difference between the subscript values of adjacent analog bus lines.

Figure 12:
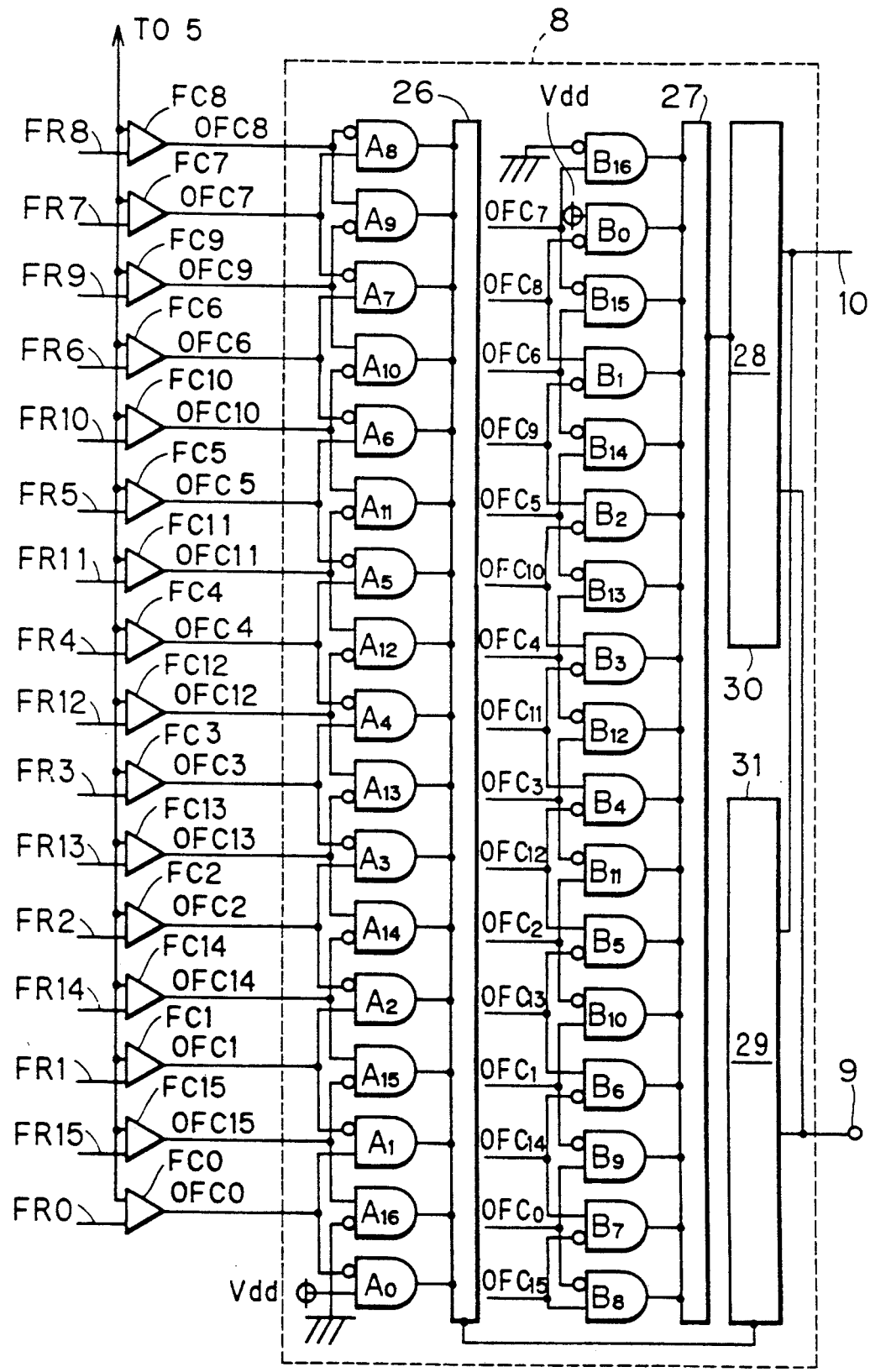
FIG. 12 illustrates a structure of the low-order encoder 8 and connection between the low-order encoder and the low-order voltage comparators FCk.

There is shown in FIG. 12 an arrangement of the low-order voltage comparators FC0 to FC15 and low-order encoder 8 when the switch matrix 12 is arranged as described hereinabove. The encoder 8 of FIG. 12 is different from that of FIG. 8 only in its arrangement, and only the difference will be discussed below.

The low-order voltage comparators FC0 to FC7 arranged in ascending order of subscript and the low-order voltage comparators FC8 to FC15 arranged in descending order of subscript are designed to alternate with each other, respectively, in accordance with the arrangement of the analog bus lines (FIG. 11). The low-order reference potentials are applied to the respective low-order voltage comparators in such a manner as described below.

(i) When it is judged that the sample signal potential falls in the voltage zone Z2h as a result of the high-order A-D conversion, the lowest low-order reference potential is applied to the low-order voltage comparator FC0 and the highest low-order reference potential is applied to the low-order voltage comparator FC15. The low-order reference potentials having the level lower than the approximately intermediate level of the voltage zones are applied in ascending order of the levels thereof to every other low-order voltage comparator from the bottom to the top. The low-order reference potentials having the level higher than the approximately intermediate level of the voltage zones are applied in the same order to every other low-order voltage comparator from the top to the bottom.

(ii) When it is judged that the sample signal potential falls in the voltage zone $Z(2h+1)$ as a result of the high-order A-D conversion, the lowest low-order reference potential is applied to the low-order voltage comparator FC8 and the highest low-order reference potential is applied to the low-order voltage comparator FC7. The low-order reference potentials having the level lower than the approximately intermediate level of the voltage zones are applied in ascending order of the levels thereof to every other low-order voltage comparator from the top to the bottom. The low-order reference potentials having the level higher than the approximately intermediate level of the voltage zones are applied in the same order to every other low-order voltage comparator from the bottom to the top.

The AND gates are arranged correspondingly in the internal structure of the low-order encoder 8. The AND gates A0 to A8 arranged in ascending order of their subscript from the bottom and the AND gates A9 to A16 arranged in descending order of their subscript from the top are designed to alternate with each other, respectively. The AND gates B0 to B16 are arranged in vertically inverted order with respect to the AND gates A0 to A16.

Such arrangement of the AND gates A0 to A16 and B0 to B16 enables the adjacent low-order voltage comparison results OFC0 to OFC16 to be inputted to adjacent AND gates which are not separated by at least two or more AND gates therebetween, whether the sample signal potential falls in the voltage zone Z2h or Z(2h+1), that is, independently of one particular analog bus line to which the lowest low-order reference potential is to be applied.

Figure 13:
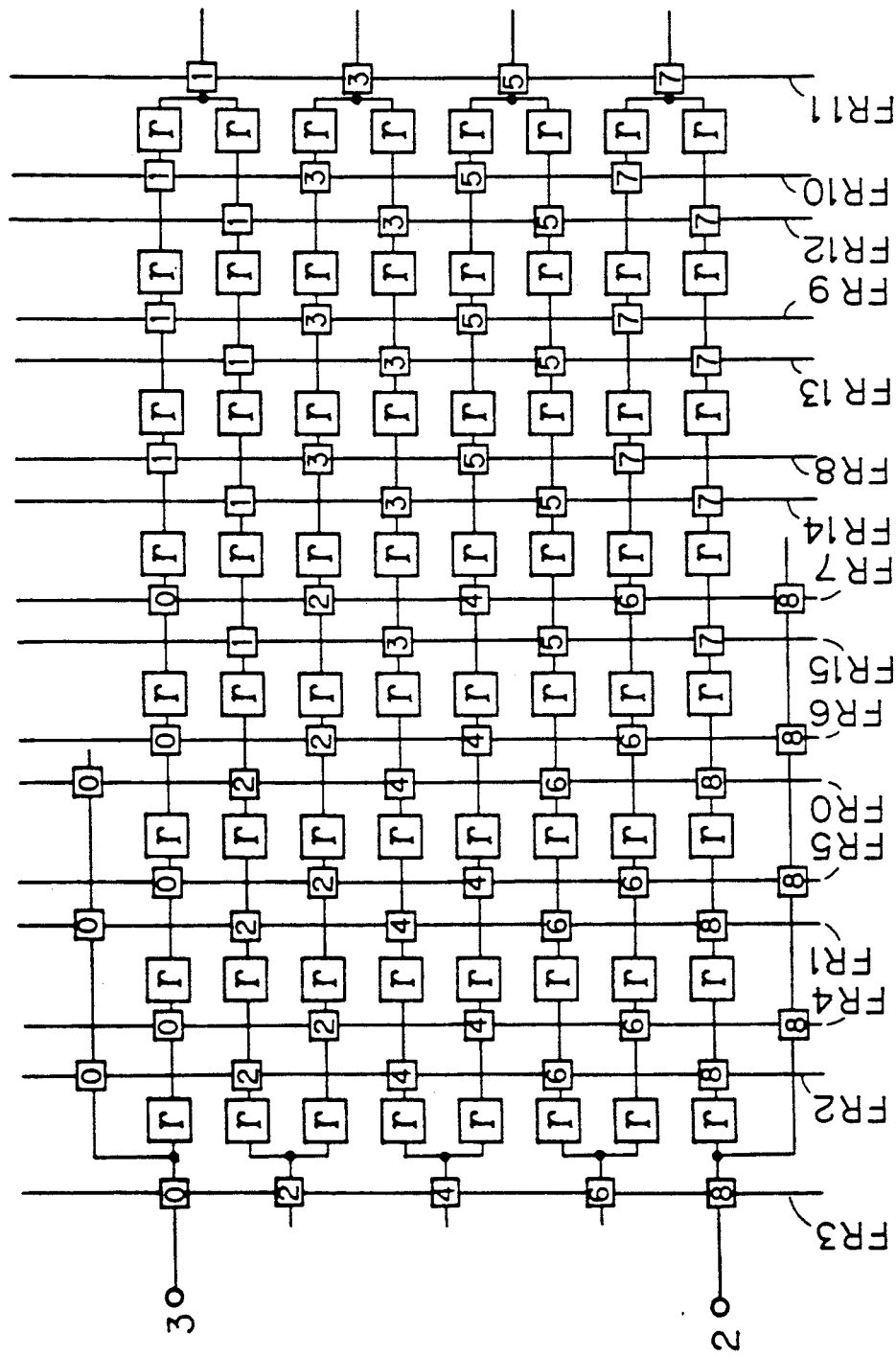
FIG. 13 illustrates a fifth preferred embodiment according to the present invention.

FIG. 13 shows a structure of the reference potential generating circuit 1 (FIG. 15) of a fifth preferred embodiment according to the present invention. The reference potential generating circuit 1 of the fifth preferred embodiment is electrically identical with that of FIG. 16 but is different therefrom in the arrangement of the analog bus lines FR0 to FR15. The ladder resistor of the fifth preferred embodiment includes several basic units of eight resistors r connected in series, the resistors r being disposed in a reciprocating manner for each basic unit. Connection is made by the switches between the analog bus lines FR0 to FR15 and the resistors r at the connecting points. The respective symbols of FIG. 13 are the same as those of FIG. 7. The closed circles of FIG. 13 indicate direct connection through no switches.

The analog bus lines FR0 to FR15 of FIG. 13 are arranged as described below. From the right to the left, the analog bus lines FR0 to FR2 are arranged in ascending order; the analog bus lines FR3 to FR10 are arranged in descending order; and the analog bus lines FR11 to FR15 are arranged in ascending order. Such arrangement of the analog bus lines FR0 to FR15 permits the low-order voltage comparators FCk, FC(k−1) to be constantly disposed close to the AND gates Ak in the fifth preferred embodiment as well as the fourth preferred embodiment.

Figure 14:
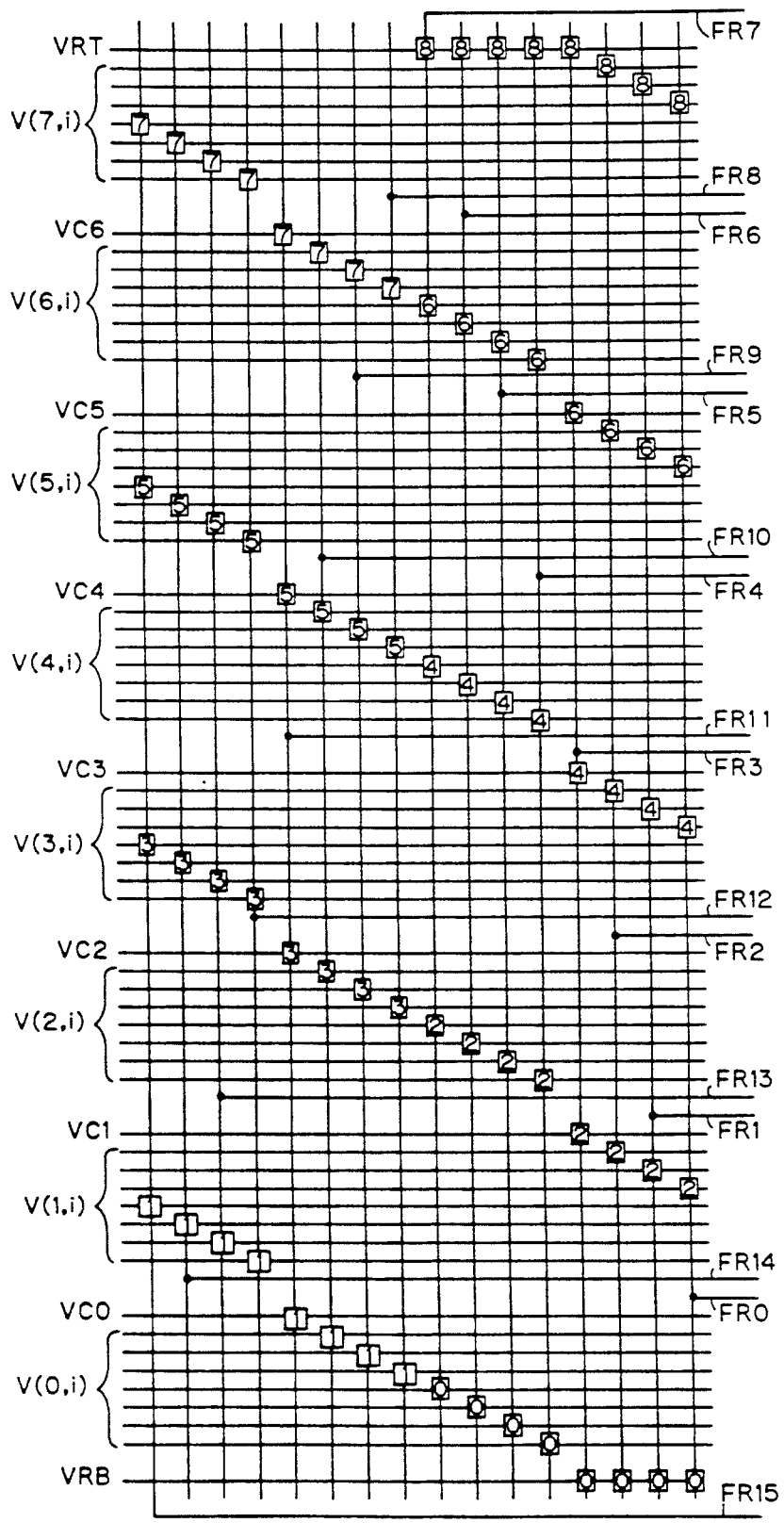
FIG. 14 illustrates a sixth preferred embodiment according to the present invention.

The analog bus lines are arranged in a straight line in the first to fifth preferred embodiments. If the configuration of the analog bus lines is not limited to the straight line, any of the low-order voltage comparators FC0 to FC14 may be used also as the high-order voltage comparators CC0 to CC6. FIG. 14 shows an internal structure of the switch matrix 12 of a sixth preferred embodiment according to the present invention. Although the structure of FIG. is basically identical with that of FIG. 7, a difference therebetween is that the analog bus lines of FIG. 14 are provided with outgoing lines orthogonal to the analog bus lines of FIG. 7.

The folded analog bus lines carry the low-order reference potentials rightwardly or FIG. 14 or toward the high-order voltage comparators CC0 to CC6 in the reference potential generating circuit 1 of FIG. 15. As described with reference to the first preferred embodiment, since the high-order and low-order A-D conversions are performed at different timings, any of the low-order voltage comparators FC0 to FC14 may be used also as the high-order voltage comparators CC0 to CC6. The sixth preferred embodiment provides for simplification of circuitry as well as reduction in settling time.

While the invention has been shown and described in detail, the foregoing description is in all aspects illustrative and not restrictive. It is therefore understood that numerous modifications and variations can be devised without departing from the scope of the invention.

What is claimed is:

1. A series-parallel A-D converter comprising
an input terminal receiving a sample signal to be A-D converted,
a high potential point,
a low potential point,
a plurality of resistor groups connected in series between said high potential point and said low potential point for dividing a potential difference between said high potential point and said low potential point to provide a plurality of first reference potentials including potentials at said high and low potential points and put in a first descending order,
said first reference potentials paired adjacent to each other in said first order defining upper and lower limits of a plurality of voltage zones corresponding to said resistor groups,
each of said resistor groups including a plurality of resistors connected in series for dividing a potential difference between the upper and lower limits of said corresponding voltage zone to provide a plurality of second reference potentials including said first reference potentials and put in a second descending order,
said second reference potentials forming a reference potential band for each of said voltage zones corresponding thereto,
a plurality of bus line groups each having a plurality of analog bus lines arranged in a third order,
a plurality of potential line bands provided in one-to-one corresponding relation to said reference potential bands and each including a plurality of reference potential lines, said second reference potential in the corresponding reference potential band being applied respectively to said reference potential lines in said second order,
first A-D conversion means for comparing said sample signal with said first reference potentials to provide a first conversion result specifying as a corresponding zone one specific voltage zone having said upper and lower limits between which said sample signal falls,
a plurality of switch groups provided in corresponding relation to said voltage zones, and
second A-D conversion means for comparing said sample signal with said second reference potentials to provide a second conversion result specifying level relation between said sample signal and said second reference potentials,
each of said reference potential bands including a high potential group having said second reference potentials of relatively high levels and a low potential group having said second reference potentials of relatively low levels,
each of said potential line bands including a high potential line group and a low potential line group, said high potential group being applied to said high potential line group, said low potential group being applied to said low potential line group, each of said switch groups including a plurality of switches disposed on said reference potential lines and said analog bus lines for connecting said reference potential lines in the corresponding potential line band to said analog bus lines with said second and third orders associated with each other, said switches only in one of said switch groups corresponding to said specific voltage zone specified by said first A-D conversion means as said corresponding zone being permitted to conduct, said switches disposed on each of said analog bus lines being smaller in number than said reference potential bands.

2. The series-parallel A-D converter of claim 1, wherein at least one of said reference potential lines in at least one of said potential line bands is permitted by said switches to be connected both to one of said analog bus lines forming one of said bus line groups and to one of said analog bus lines forming another one of said bus line groups.

3. The series-parallel A-D converter of claim 2, wherein said analog bus lines of said one bus line group are permitted by said switches to be connected to at least said reference potential lines of said potential line band of a relatively high rank in said first order, and said analog bus lines of said another bus line group are permitted by said switches to be connected to at least said reference potential lines of said potential line band of a relatively low rank in said first order.

4. The series-parallel A-D converter of claim 3, further comprising error correction means for correcting said first conversion result as a function of said second conversion result to provide a third conversion result.

5. The series-parallel A-D converter of claim 4, wherein said switches included in one of said switch groups of an intermediate rank in said first order connect;

said low potential line group of said potential line band of a rank higher by one in said first order than the rank of said one switch group to said analog bus lines of a relatively high rank in said third order, and said high potential line group of said potential line band of a rank lower by one in said first order than the rank of said one switch group to said analog bus lines of a relatively low rank in said third order.

6. The series-parallel A-D converter of claim 5, wherein said switches included in said switch group of the highest rank in said first order connect;

said high potential line group of said potential line band of the second highest rank in said first order to said analog bus lines of the relatively low rank in said third order, and said reference potential lines to which the highest second reference potential is applied to said analog bus lines of the relatively high rank in said third order.

7. The series-parallel A-D converter of claim 6, wherein said switches included in said switch group of the lowest rank in said first order connect;

said low potential line group of said potential line band of the second lowest rank in said first order to said analog bus lines of the relatively high rank in said third order, and said reference potential lines to which the lowest second reference potential is applied to said analog bus lines of the relatively low rank in said third order.

8. The series-parallel A-D converter of claim 7, wherein said plurality of potential line bands are divided into a plurality of first and second potential line bands, the ranks of said first and second potential line bands being discontinuous with each other in said first order, said analog bus lines of said one bus line group being permitted by said switches to be connected to said reference potential lines in said plurality of first potential line bands, said analog bus lines of said another bus line group being permitted by said switches to be connected to said reference potential lines in said plurality of second potential line bands.

9. A series-parallel A-D converter comprising an input terminal receiving a sample signal to be A-D converted, a high potential point, a low potential point, a plurality of resistor groups connected in series between said high potential point and said low potential point for dividing a potential difference between said high potential point and said low potential point to provide a plurality of first reference potentials including potentials at said high and low potential points and put in a first descending order, said first reference potentials paired adjacent to each other in said first order defining upper and lower limits of a plurality of voltage zones corresponding to said resistor groups, each of said resistor groups including a plurality of resistors connected in series for dividing a potential difference between the upper and lower limits of said corresponding voltage zone to provide a plurality of second reference potentials including said first reference potentials and put in a second descending order, said second reference potentials forming a reference potential band for each of said voltage zones corresponding thereto, said reference potential bands being divided into first and second reference potential bands whose ranks are discontinuous with each other in said first order, each of said reference potential bands including a high potential group having said second reference potentials of relatively high levels and a low potential group having said second reference potentials of relatively low levels, a bus line group including a plurality of analog bus lines arranged in a third order, first A-D conversion means for comparing said sample signal with said first reference potentials to provide a first conversion result specifying as a corresponding zone one specific voltage zone having said upper and lower limits between which said sample signal falls, a switch band including a plurality of switches disposed on said reference potential lines and said analog bus lines for connecting said reference potential lines to said analog bus lines, second A-D conversion means for comparing said sample signal with said second reference potentials to provide a second conversion result specifying level relation between said sample signal and said second reference potentials, and error correction means for correcting said first conversion result as a function of said second conversion result to provide a third conversion result, said switches disposed on each of said analog bus lines being smaller in number than said reference potential bands.

10. The series-parallel A-D converter of claim 9, further comprising a plurality of potential line bands provide in one-to-one corresponding relation to said reference potential bands and each including a plurality of reference potential lines, said second reference potentials in the corresponding reference potential band being applied respectively to said reference potential lines in said second order, each of said potential line bands including a high potential line group to which said high potential line group is applied and a low potential line group to which said low potential group is applied.

11. The series-parallel A-D converter of claim 10, wherein said bus line group is divided into first, second, third and fourth bus line groups from the highest rank in said third order, wherein said potential line bands are divided into first and second potential line bands corresponding to said first and second reference potential bands, respectively, and wherein said switches connect;

said high and low potential line groups in one of said first potential line bands of an intermediate rank in said first order to said second and third bus line groups, respectively, said low potential line group in said second potential line band of a rank higher by one in said first order than the rank of said one first potential line band to said first bus line group, and said high potential line group in said second potential line band of a rank lower by one in said first order than the rank of said one first potential line band to said fourth bus line group.

12. The series-parallel A-D converter of claim 11, wherein said potential line band of the lowest rank in said first order belongs to said first potential line band, and said switches in said potential line band of the lowest rank in said first order further connect;

said high and low potential line groups to said second and third bus line groups, respectively, said low potential line group in said second potential line band of the second lowest rank in said first order to said first bus line group, and said reference potential lines to which the lowest second reference potential is applied to said fourth bus line group.

13. The series-parallel A-D converter of claim 12, wherein said potential line band of the highest rank in said first order belongs to said second potential line band, and said switches in said potential line band of the highest rank in said first order further connect;

said high and low potential line groups of said fourth and first bus line groups, respectively, said low potential line group in said first potential line band of the second highest rank in said first order to said second bus line group, and said reference potential lines to which the highest second reference potential is applied to said third bus line group.

14. The series-parallel A-D converter of claim 13 wherein, permitted to conduct when one of said voltage zones of said intermediate rank in said first order is specified as said corresponding zone are:

said switches disposed on said high potential line group in one of said potential line bands corresponding to said one voltage zone, said switches disposed on said low potential line group in said one potential line band, said switches disposed on said low potential line group in said potential line band of a rank higher by one in said first order than the rank of said one potential line band, and said switches disposed on said high potential line group in said potential line band of a rank lower by one in said first order than the rank of said one potential line band.

15. The series-parallel A-D converter of claim 14, wherein one of said potential line bands of the lowest rank in said first order is said first potential line band, and permitted to conduct when one of said voltage zones corresponding to said one potential line band is specified as said corresponding zone are:

said switches disposed on said high potential line group in said one potential line band, said switches disposed on said low potential line group in said one potential line band, said switches disposed on said low potential line group in said potential line band of the second lowest rank in said first order, and said switches disposed on said reference potential lines to which the lowest second reference potential is applied.

16. The series-parallel A-D converter of claim 15, wherein one of said potential line bands of the highest rank in said first order is said second potential line band, and permitted to conduct when one of said voltage zones corresponding to said one potential line band is specified as said corresponding zone are:

said switches disposed on said high potential line group in said one potential line band, said switches disposed on said low potential line group in said one potential line band, said switches disposed on said high potential line group in said potential line band of the second highest rank in said first order, and said switches disposed on said reference potential lines to which the highest second reference potential is applied.

17. The series-parallel A-D converter of claim 16, wherein said bus line group further includes outgoing lines connected to said bus lines at right angles, respectively.

18. The series-parallel A-D converter of claim 11, wherein said bus lines are arranged in order of difference between the ranks of said bus lines paired adjacent to each other in said third order.

19. The series-parallel A-D converter of claim 18, wherein
said second A-D conversion means includes comparators equal in number to said bus lines of said bus line group, and
said comparators are arranged in corresponding relation to the arrangement of said bus lines.

20. The series-parallel A-D converter of claim 11, wherein
said bus lines are arranged in said third order.

21. The series-parallel A-D converter of claim 9,
wherein said bus line group is divided into first, second, third and fourth bus line groups from the highest rank in said third order,
wherein said reference potential bands are classified into first and second reference potential bands whose ranks are discontinuous with each other in said first order, and
wherein said switches connect;
said second and third bus line groups with connecting points of said resistors at which said second reference potentials of said high and low potential groups in one of said first reference potential bands of an intermediate rank in said first order are developed, respectively,
said first bus line group with connecting points of said resistors at which said second reference potentials of said low potential group in said second potential band of a rank higher by one in said first order than the rank of said one first reference potentials band are developed, and
said fourth bus line group with connecting points of said resistors at which said second reference potentials of said high potential group in said second reference potential band of a rank lower by one in said first order than the rank of said one first reference potential band are developed.

22. The series-parallel A-D converter of claim 21, wherein
said potential band of the lowest rank in said first order belongs to said first reference potential band, and
said switches in said potential band of the lowest rank in said first order connect;
said second and third bus line groups with connecting points of said resistors at which said second reference potentials of said high and low potential groups are developed, respectively,
said first bus line group with connecting points of said resistors at which said second reference potentials of said low potential group in said second reference potential band of the second lowest rank in said first order are developed, and
said fourth bus line group with connecting points of said resistors at which the lowest second reference potential is developed.

23. The series-parallel A-D converter of claim 22, wherein
said potential band of the highest rank in said first order belongs to said second reference potential band, and
said switches in said potential band of the highest rank in said first order connect;
said fourth and first bus line groups with connecting points of said resistors at which said second reference potentials of said high and low potential groups are developed, respectively,
said second bus line group with connecting points of said resistors at which said second reference potentials of said low potential group in said second reference potential band of the second highest rank in said first order are developed, and
said third bus line group with connecting points of said resistors at which the highest second reference potential is developed.

24. The series-parallel A-D converter of claim 23, wherein
permitted to conduct when one of said voltage zones of said intermediate rank in said first order is specified as said corresponding zone are:
said switches disposed at connecting points of said resistors at which said high potential group in one of said reference potential bands corresponding to said one voltage zone is developed,
said switches disposed at connecting points of said resistors at which said low potential group in said one reference potential band is developed,
said switches disposed at connecting points of said resistors at which said low potential group in said reference voltage band of a rank higher by one in said first order than the rank of said one reference potential band is developed, and
said switches disposed at connecting points of said resistors at which said high potential group in said reference potential band of a rank lower by one in said first order than the rank of said one reference potential band.

25. The series-parallel A-D converter of claim 24, wherein
one of said reference potential bands of the lowest rank in said first order is said first reference potential band, and
permitted to conduct when one of said voltage zones corresponding to said one reference potential band is specified as said corresponding zone are:
said switches disposed at connecting points of said resistors at which said high potential group in said one reference potential band is developed,
said switches disposed at connecting points of said resistors at which said low potential group in said one reference potential band is developed,
said switches disposed at connecting points of said resistors at which said low potential group in said reference potential band of the second lowest rank in said first order is developed, and
said switches disposed at connecting points of said resistors to which the lowest second reference potential is applied.

26. The series-parallel A-D converter of claim 25, wherein
one of said reference potential bands of the highest rank in said first order is said second reference potential band, and
permitted to conduct when one of said voltage zones corresponding to said one reference potential band is specified as said corresponding zone are:
said switches disposed at connecting points of said resistors at which said high potential group in said one reference potential band is developed,
said switches disposed at connecting points of said resistors at which said low potential group in said one reference potential band is developed, said switches disposed at connecting points of said resistors at which said low potential group in said reference potential band of the second highest rank in said first order is developed, and said switches disposed at connecting points of said resistors to which the highest second reference potential is applied.

27. The series-parallel A-D converter of claim 26, wherein said resistors are arranged crosswise to said analog bus lines in a reciprocating manner.

* * * * *